(12) United States Patent
Shim et al.

(10) Patent No.: US 11,678,548 B2
(45) Date of Patent: Jun. 13, 2023

(54) DISPLAY DEVICE WITH REDUCED POWER CONSUMPTION

(71) Applicant: LG Display Co., Ltd., Seoul (KR)

(72) Inventors: Sungbin Shim, Paju-si (KR); MoonBae Gee, Paju-si (KR)

(73) Assignee: LG Display Co., Ltd., Seoul (KR)

( * ) Notice: Subject to any disclaimer, the term of this patent is extended or adjusted under 35 U.S.C. 154(b) by 0 days.

(21) Appl. No.: 16/552,316

(22) Filed: Aug. 27, 2019

(65) Prior Publication Data

US 2020/0212119 A1 Jul. 2, 2020

(30) Foreign Application Priority Data

Dec. 26, 2018 (KR) .................. 10-2018-0169072

(51) Int. Cl.
*H01L 27/32* (2006.01)
(52) U.S. Cl.
CPC ...... *H01L 27/3209* (2013.01); *H01L 27/3211* (2013.01); *H01L 27/3246* (2013.01); *H01L 27/3248* (2013.01); *H01L 27/3258* (2013.01); *H01L 27/322* (2013.01)

(58) Field of Classification Search
CPC ..... H01L 27/15; H01L 27/32; H01L 27/3258; H01L 27/3246; H01L 27/3209; H01L 27/3211; H01L 27/3248; H01L 27/322; H01L 27/3244; H01L 51/5044; H01L 51/5278
USPC .......................................... 257/40
See application file for complete search history.

(56) References Cited

U.S. PATENT DOCUMENTS

| 6,903,718 B2 | 6/2005 | Son |
| 7,575,836 B2 | 8/2009 | Tsubata et al. |
| 9,911,760 B2 | 3/2018 | Kim et al. |
| (Continued) |

FOREIGN PATENT DOCUMENTS

| CN | 104538553 A | 4/2015 |
| CN | 107079559 A | 8/2017 |
| (Continued) |

OTHER PUBLICATIONS

Office Action issued in corresponding CN Patent Application No. 201910845660.2, dated Feb. 10, 2023.

*Primary Examiner* — Sheng-Bai Zhu
(74) *Attorney, Agent, or Firm* — Morgan, Lewis & Bockius LLP

(57) ABSTRACT

A display device is disclosed. The display device includes: a substrate including a first sub-pixel and a second sub-pixel; a first electrode in each of the first sub-pixel and the second sub-pixel; a third electrode in each of the first sub-pixel and the second sub-pixel; a second electrode between the first electrode and the third electrode; a first light-emitting layer between the first electrode and the second electrode, wherein the first light-emitting layer emits light of a first color; a second light-emitting layer between the second electrode and the third electrode, wherein the second light-emitting layer is configured to emit mixed light of second and third colors; and a color filter including a first color filter corresponding to the first sub-pixel and a second color filter corresponding to the second sub-pixel, wherein the first sub-pixel and the second sub-pixel each are configured to emit light of three colors.

13 Claims, 24 Drawing Sheets

(56) References Cited

U.S. PATENT DOCUMENTS

| | | | |
|---|---|---|---|
| 2007/0200979 A1* | 8/2007 | Rudin | G02F 1/133514 |
| | | | 349/106 |
| 2010/0053385 A1* | 3/2010 | Choe | H04N 9/04553 |
| | | | 348/273 |
| 2011/0043495 A1* | 2/2011 | Bang | H01L 27/3276 |
| | | | 345/204 |
| 2011/0121738 A1 | 5/2011 | Kawano et al. | |
| 2011/0127906 A1 | 6/2011 | Mitsuya et al. | |
| 2014/0117362 A1* | 5/2014 | Xi | H01L 29/78669 |
| | | | 257/59 |
| 2014/0183471 A1 | 7/2014 | Heo | |
| 2015/0090966 A1* | 4/2015 | Hyun | H01L 27/3276 |
| | | | 257/40 |
| 2015/0349278 A1* | 12/2015 | Inoue | C09K 11/06 |
| | | | 257/40 |
| 2016/0276422 A1* | 9/2016 | Kim | H01L 27/3258 |
| 2017/0278894 A1* | 9/2017 | Sato | H01L 51/502 |
| 2018/0122876 A1 | 5/2018 | Shim et al. | |
| 2018/0182814 A1 | 6/2018 | Kim et al. | |
| 2018/0331162 A1* | 11/2018 | Wu | H01L 27/3202 |
| 2019/0157597 A1 | 5/2019 | Liao et al. | |
| 2021/0083016 A1 | 3/2021 | Yamabuchi | |

FOREIGN PATENT DOCUMENTS

| | | |
|---|---|---|
| CN | 107958962 A | 4/2018 |
| CN | 108022953 A | 5/2018 |
| EP | 3 026 724 A1 | 6/2016 |
| KR | 10-0385880 B1 | 6/2003 |
| KR | 10-0689139 B1 | 3/2007 |
| KR | 10-0950517 B1 | 3/2010 |
| KR | 10-2017-0033929 A | 3/2017 |
| KR | 10-2017-0038061 A | 4/2017 |
| WO | 2018/229859 A1 | 12/2018 |

* cited by examiner

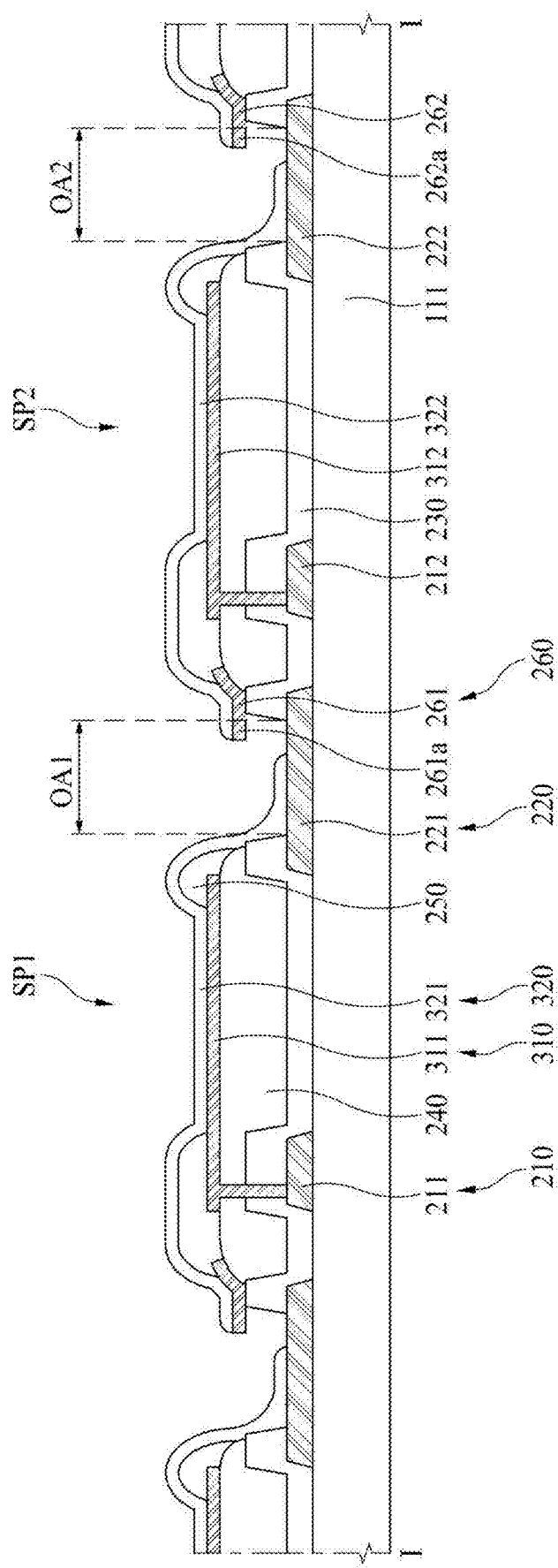

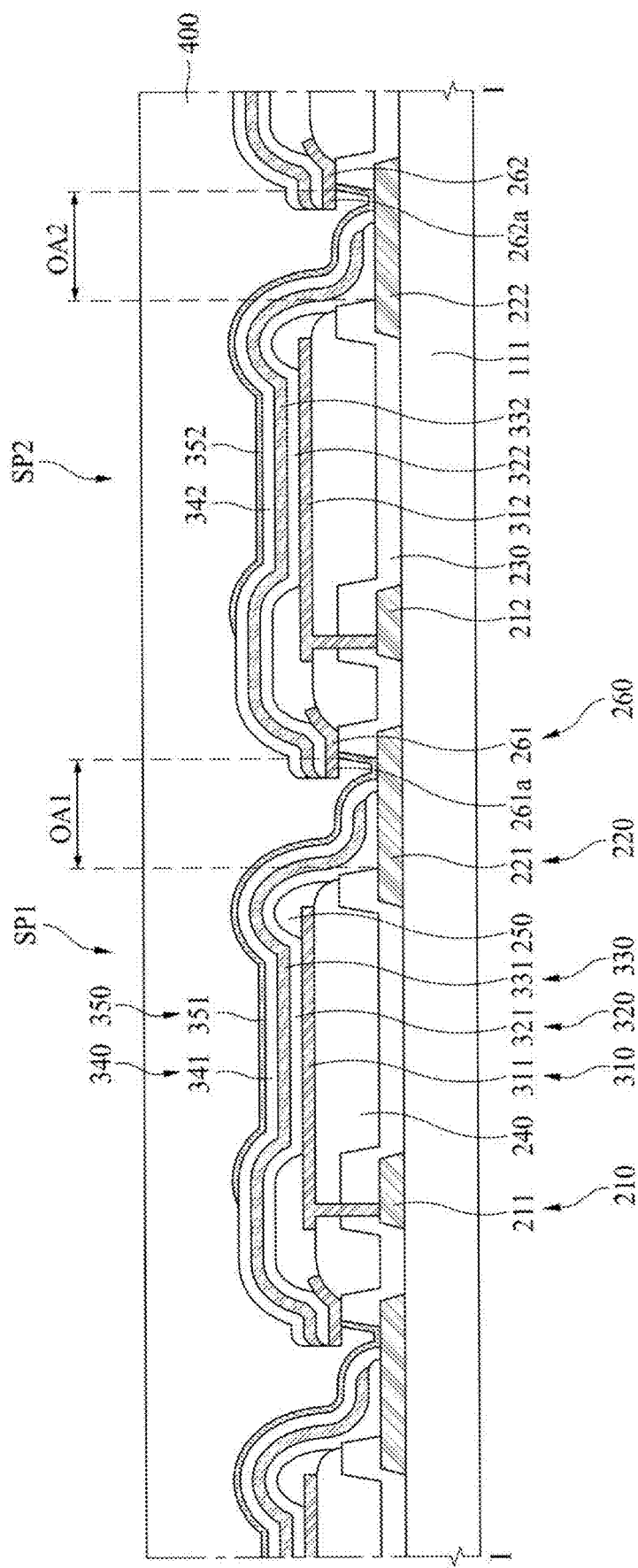

DISPLAY DEVICE WITH REDUCED POWER CONSUMPTION

This application claims priority from and the benefit of Korean Patent Application No. 10-2018-0169072 filed on Dec. 26, 2018, which is incorporated herein by reference in its entirety for all purposes as if fully set forth herein.

BACKGROUND

Technical Field

The present disclosure relates to a display device.

Description of the Related Art

With the advancement of the information age, a demand for a display device for displaying an image has been increased in various forms. Therefore, various display devices such as liquid crystal display (LCD) devices, plasma display panel (PDP) devices, and organic light-emitting display (OLED) devices have been used. Recently, a head mounted display (HMD) including such a display device has been developed. The head mounted display (HMD) is a glasses type monitor device for virtual reality (VR) or augmented reality that is worn in the form of glasses or a helmet to form an image at a distance close to a user's eyes.

This head mounted display has difficulty in accurately forming light-emitting layers of different colors per sub-pixel in a pattern due to a compact pixel interval of high resolution. To solve this problem, the head mounted display may realize different colors by forming a white light-emitting layer including a plurality of stacks for emitting light of different colors as a common layer and arranging a color filter per sub-pixel. Therefore, the head mounted display has an advantage in that it does not require an accurate mask manufacture or an accurate mask alignment process. However, a high level of power is consumed due to the plurality of stacks.

SUMMARY

Accordingly, embodiments of the present disclosure are directed to a display device that substantially obviates one or more of the problems due to limitations and disadvantages of the related art. Features and aspects will be set forth in the description that follows, and in part will be apparent from the description, or may be learned by practice of the inventive concepts provided herein. Other features and aspects of the inventive concepts may be realized and attained by the structure particularly pointed out in the written description, or derivable therefrom, and the claims hereof as well as the appended drawings.

To achieve these and other aspects of the inventive concepts, as embodied and broadly described, a display device is provided. The display device may include a substrate including a first sub-pixel and a second sub-pixel. The display device may further include a first electrode in each of the first sub-pixel and the second sub-pixel. The display device may further include a third electrode in each of the first sub-pixel and the second sub-pixel. The display device may further include a second electrode between the first electrode and the third electrode. The display device may further include a first light-emitting layer between the first electrode and the second electrode, wherein the first light-emitting layer emits light of a first color. The display device may further include a second light-emitting layer between the second electrode and the third electrode, wherein the second light-emitting layer is configured to emit mixed light of second and third colors that are different from each other. The display device may further include a color filter including a first color filter corresponding to the first sub-pixel and a second color filter corresponding to the second sub-pixel, wherein the first sub-pixel and the second sub-pixel each are configured to emit light of at least three colors.

In accordance with another aspect of the present disclosure, there a display device is provided. The display device may include a substrate including a first sub-pixel and a second sub-pixel. The display device may further include a first driving transistor in each of the first sub-pixel and the second sub-pixel on the substrate. The display device may further include a second driving transistor in each of the first sub-pixel and the second sub-pixel on the substrate. The display device may further include a first electrode in each of the first sub-pixel and the second sub-pixel and connected to the first driving transistor. The display device may further include a first light-emitting layer on the first electrode, wherein the first light-emitting layer is configured to emit light of a first color. The display device may further include a second electrode on the first light-emitting layer. The display device may further include a second light-emitting layer on the second electrode, wherein the second light-emitting layer is configured to emit light of a second color. The display device may further include a third electrode in each of the first sub-pixel and the second sub-pixel on the second light-emitting layer and connected to the second driving transistor.

According to the present disclosure, each sub-pixel may allow the first light-emitting layer and the second light-emitting layer to emit light independently of each other. Therefore, in the present disclosure, power consumption may be reduced in comparison with a display device having a tandem structure in which a plurality of stacks are arranged by interposing a charge generating layer therebetween. In addition, the third electrode may easily be connected to the second driving transistor by using the masking pattern. A contact hole for connecting the third electrode to the second driving transistor may not be formed, and the masking pattern may be formed simultaneously with the first electrode, whereby a separate process is not required. Also, in the present disclosure, because one pixel includes two sub-pixels, an aperture ratio of a panel may be increased.

Additional advantages and features of the present disclosure will be understood by those skilled in the art from the following description. It is to be understood that both the foregoing general description and the following detailed description are exemplary and explanatory and are intended to provide further explanation of the inventive concepts as claimed.

BRIEF DESCRIPTION OF THE DRAWINGS

The accompanying drawings, which are included to provide a further understanding of the disclosure and are incorporated and constitute a part of this application, illustrate embodiments of the disclosure and together with the description serve to explain various principles. In the drawings:

FIGS. 12A to 12L are cross-sectional views illustrating a method for manufacturing a display device according to the first example embodiment of the present disclosure.

DETAILED DESCRIPTION

Figure 1:
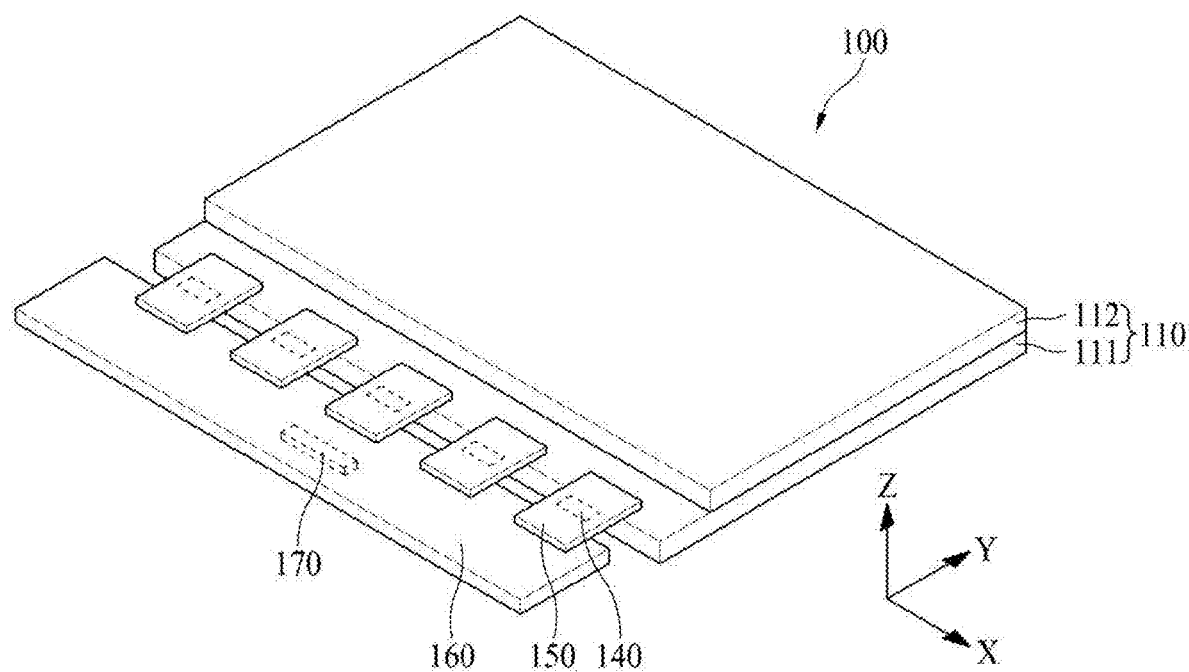
FIG. 1 illustrates a display device according to one example embodiment of the present disclosure.

Reference will now be made in detail to embodiments of the present disclosure, examples of which may be illustrated in the accompanying drawings. In the following description, a detailed description of functions or configurations related to this document that are well-known to those skilled in the art may be omitted. The progression of processing steps and/or operations described is an example. The sequence of steps and/or operations is not limited to that set forth herein and may be changed as is known in the art or apparent to those skilled in the art, with the exception of steps and/or operations necessarily occurring in a particular order. Names of the respective elements used in the following explanations are selected only for convenience of writing the specification and may thus be different from those used in actual products.

Advantages and features of the present disclosure, and implementation methods thereof will be clarified through following example embodiments described with reference to the accompanying drawings. The present disclosure may, however, be embodied in different forms and should not be construed as limited to the example embodiments set forth herein. Rather, these example embodiments are provided so that this disclosure may be sufficiently thorough and complete to assist those skilled in the art to fully understand the scope of the present disclosure. Further, the present disclosure is only defined by scopes of claims.

A shape, a size, a ratio, an angle, and a number disclosed in the drawings for describing embodiments of the present disclosure are merely an example. Thus, the present disclosure is not limited to the illustrated details. Unless otherwise described, like reference numerals refer to like elements throughout. In the following description, when the detailed description of the relevant known function or configuration is determined to unnecessarily obscure an important point of the present disclosure, the detailed description of such known function or configuration may be omitted. In a case where terms "comprise," "have," and "include" described in the present specification are used, another part may be added unless a more limiting term, such as "only," is used. The terms of a singular form may include plural forms unless referred to the contrary.

In construing an element, the element is construed as including an error or tolerance range even where no explicit description of such an error or tolerance range. In describing a position relationship, when a position relation between two parts is described as, for example, "on," "over," "under," or "next," one or more other parts may be disposed between the two parts unless a more limiting term, such as "just" or "direct(ly)," is used. In describing a time relationship, when the temporal order is described as, for example, "after," "subsequent," "next," or "before," a case which is not continuous may be included unless a more limiting term, such as "just," "immediate(ly)," or "direct(ly)," is used.

It will be understood that, although the terms like "first," "second," etc., may be used herein to describe various elements, these elements should not be limited by these terms as they are not used to define a particular order. These terms are used only to distinguish one element from another. For example, a first element could be termed a second element, and, similarly, a second element could be termed a first element, without departing from the scope of the present disclosure. In describing elements of the present disclosure, the terms like "first," "second," "A," "B," "(a)," and "(b)" may be used. These terms are merely for differentiating one element from another element, and the essence, sequence, order, or number of a corresponding element should not be limited by the terms. Also, when an element or layer is described as being "connected," "coupled," or "adhered" to another element or layer, the element or layer can not only be directly connected or adhered to that other element or layer, but also be indirectly connected or adhered to the other element or layer with one or more intervening elements or layers "disposed" between the elements or layers, unless otherwise specified.

The term "at least one" should be understood as including any and all combinations of one or more of the associated listed items. For example, the meaning of "at least one of a first item, a second item, and a third item" encompasses the combination of all items proposed from two or more of the first item, the second item, and the third item as well as the first item, the second item, or the third item. In the description of embodiments, when a structure is described as being positioned "on or above" or "under or below" another structure, this description should be construed as including a case in which the structures contact each other as well as a case in which a third structure is disposed therebetween. The size and thickness of each element shown in the drawings are given merely for the convenience of description, and embodiments of the present disclosure are not limited thereto, unless otherwise specified. Features of various embodiments of the present disclosure may be partially or overall coupled to or combined with each other, and may be variously inter-operated with each other and driven technically as those skilled in the art can sufficiently understand. Embodiments of the present disclosure may be carried out independently from each other, or may be carried out together in a co-dependent relationship.

FIG. 1 illustrates a display device according to one example embodiment of the present disclosure. As illustrated in FIG. 1, the display device 100 according to one example embodiment of the present disclosure includes a display panel 110, a source drive integrated circuit (IC) 140, a flexible film 150, a circuit board 160, and a timing controller 170. The display panel 110 includes a first substrate 111 and a second substrate 112. The second substrate 112 may be an encapsulation substrate. The first substrate 111 may be a plastic film, a glass substrate, or a silicon wafer substrate formed using a semiconductor process. The second substrate 112 may be a plastic film, a glass substrate, or an encapsulation film.

Gate lines, data lines and sub-pixels may be provided on one surface of the first substrate 111 facing the second substrate 112. The sub-pixels may be provided in an area defined by a crossing structure of the gate lines and the data lines. Each of the sub-pixels may include a transistor, and a light-emitting diode that includes an anode electrode, a light-emitting layer, and a cathode electrode. Each of the sub-pixels may supply a predetermined current to the light-emitting diode in accordance with a data voltage of the data line if a gate signal is input from the gate line by using the transistor. For this reason, the light-emitting layer of each of the sub-pixels may emit light with a predetermined brightness in accordance with the predetermined current if a high potential voltage is applied to the anode electrode and a low potential voltage is applied to the cathode electrode.

The display panel 110 may be categorized into a display area DA where the sub-pixels are provided to display an image, and a non-display area NDA where an image is not displayed. The gate lines, the data lines and the sub-pixels may be provided on the display area DA. A gate driver and pads may be provided on the non-display area NDA. The gate driver supplies gate signals to the gate lines in accordance with a gate control signal input from the timing controller 170. The gate driver may be provided on the non-display area NDA outside one side or both sides of the display area DA of the display panel 110 in a gate driver in panel (GIP) mode. Alternatively, the gate driver may be fabricated of a driving chip, packaged in a flexible film and attached to the non-display area NDA outside one side or both sides of the display area DA of the display panel 110 in a tape automated bonding (TAB) mode.

The source drive IC 140 receives digital video data and a source control signal from the timing controller 170. The source drive IC 140 converts the digital video data to analog data voltages in accordance with the source control signal and supplies the analog data voltages to the data lines. If the source drive IC 140 is fabricated as a driving chip, the source drive IC 140 may be packaged in the flexible film 150 in a chip on film (COF) or chip on plastic (COP) mode. Pads such as data pads may be provided on the non-display area NDA of the display panel 110. Lines that connect the pads with the source drive IC 140 and lines that connect the pads with lines of the circuit board 160 may be provided in the flexible film 150. The flexible film 150 may be attached onto the pads by an anisotropic conducting film, whereby the pads may be connected with the lines of the flexible film 150.

The circuit board 150 may be attached to the flexible films 150. A plurality of circuits including driving chips may be packaged in the circuit board 160. For example, the timing controller 170 may be packaged in the circuit board 160. The circuit board 160 may be a printed circuit board or a flexible printed circuit board. The timing controller 170 may receive digital video data and a timing signal from an external system board through a cable of the circuit board 160. The timing controller 170 may generate a gate control signal for controlling an operation timing of the gate driver and a source control signal for controlling the source drive ICs 140 on the basis of the timing signal. The timing controller 170 may supply the gate control signal to the gate driver, and may supply the source control signal to the source drive ICs 140.

Figure 2:
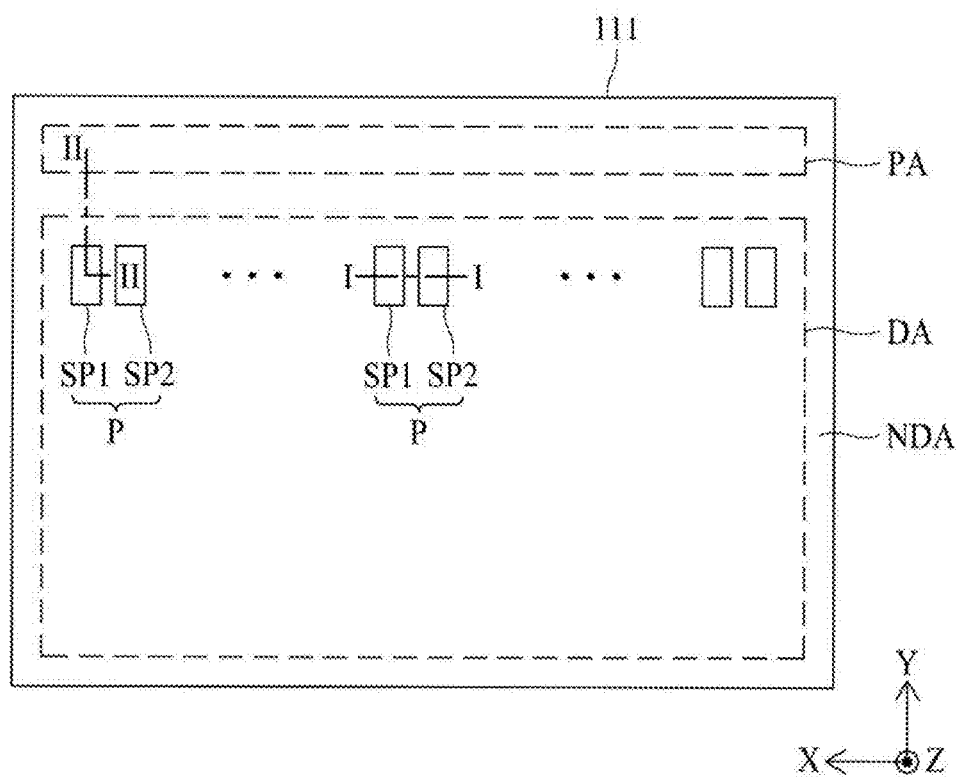
FIG. 2 illustrates a first substrate of a display panel according to one example embodiment of the present disclosure.
Figure 3:
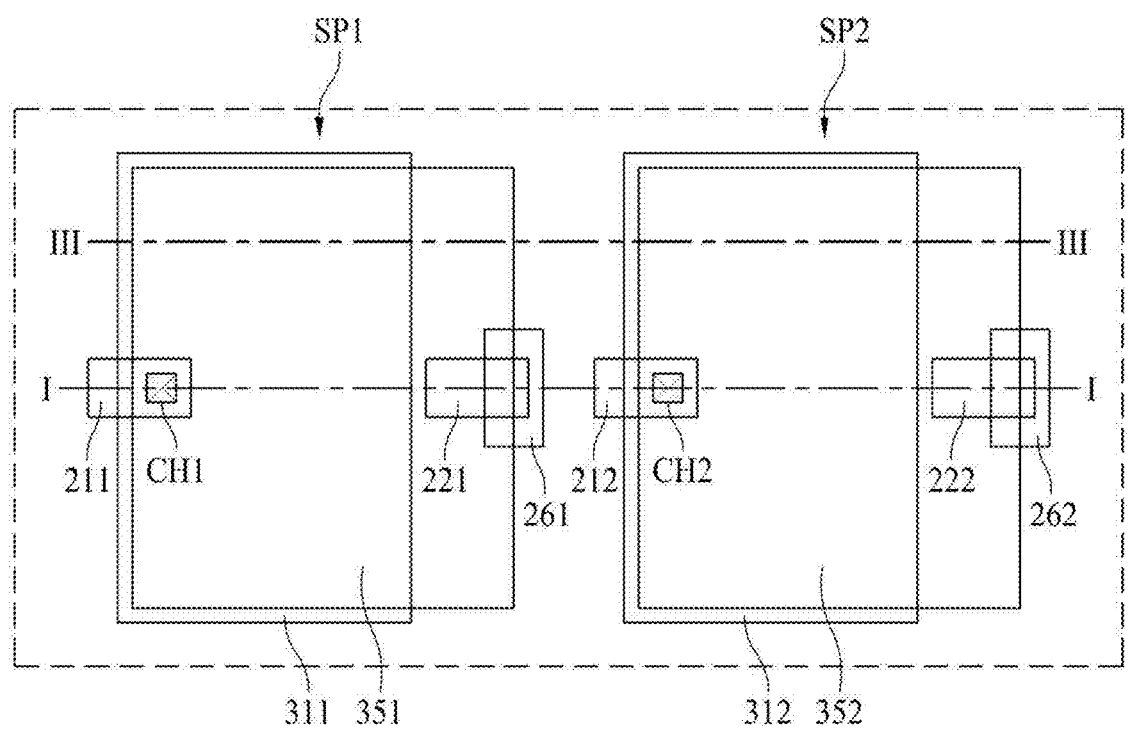
FIG. 3 illustrates an example of a first sub-pixel and a second sub-pixel.
Figure 4:
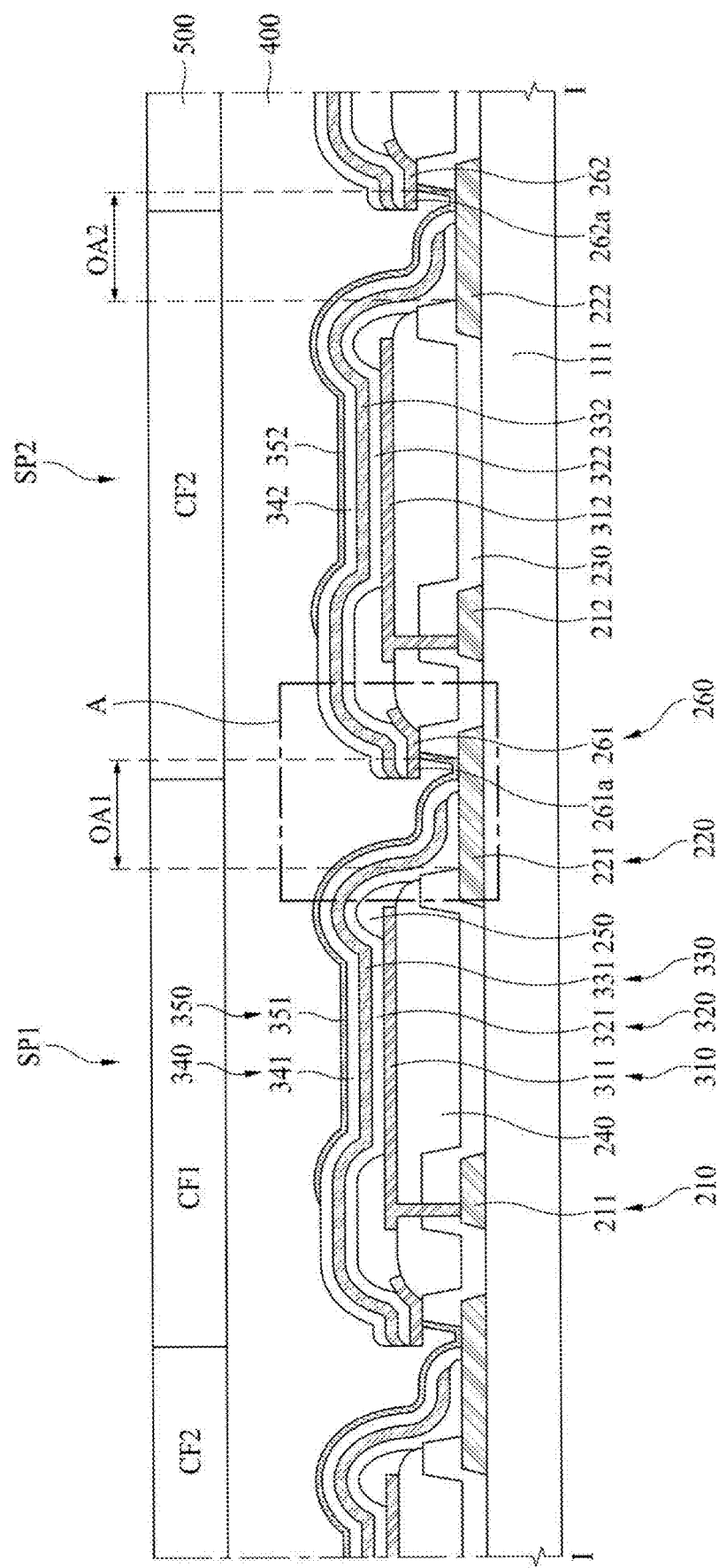
FIG. 4 is a cross-sectional view illustrating an example of line I-I in FIG. 2.
Figure 5:
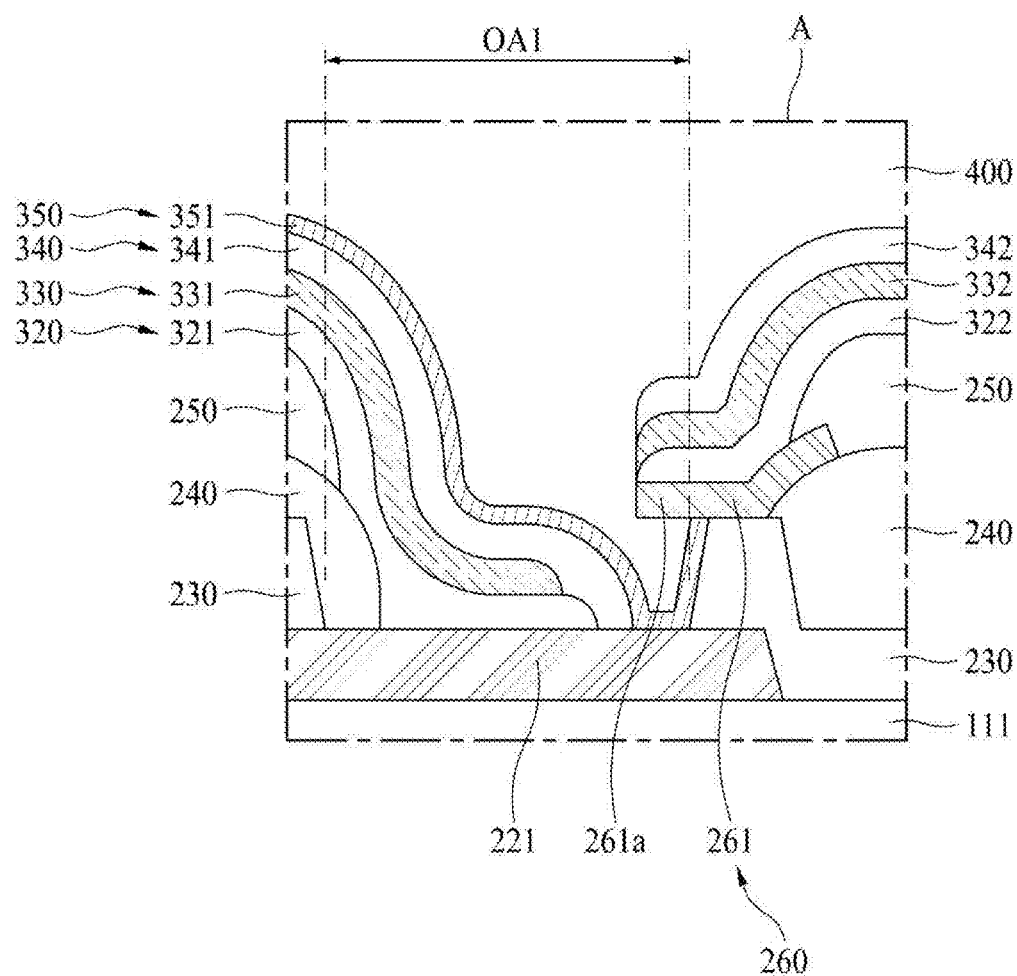
FIG. 5 is an enlarged view illustrating an example of area A in FIG. 4.
Figure 6:
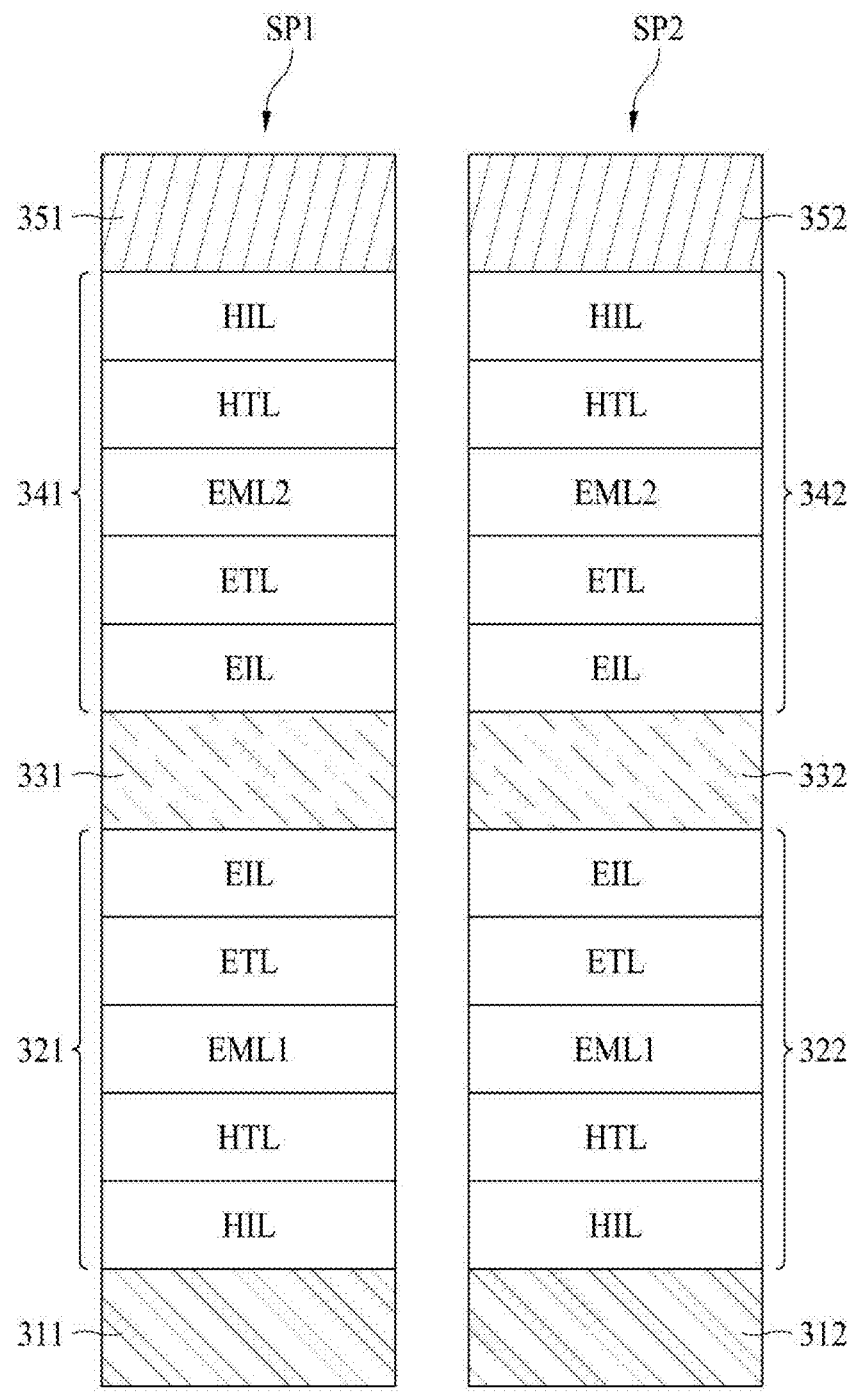
FIG. 6 is a cross-sectional view illustrating an example of a first electrode and a light-emitting layer in a display device according to one example embodiment of the present disclosure.
Figure 7:
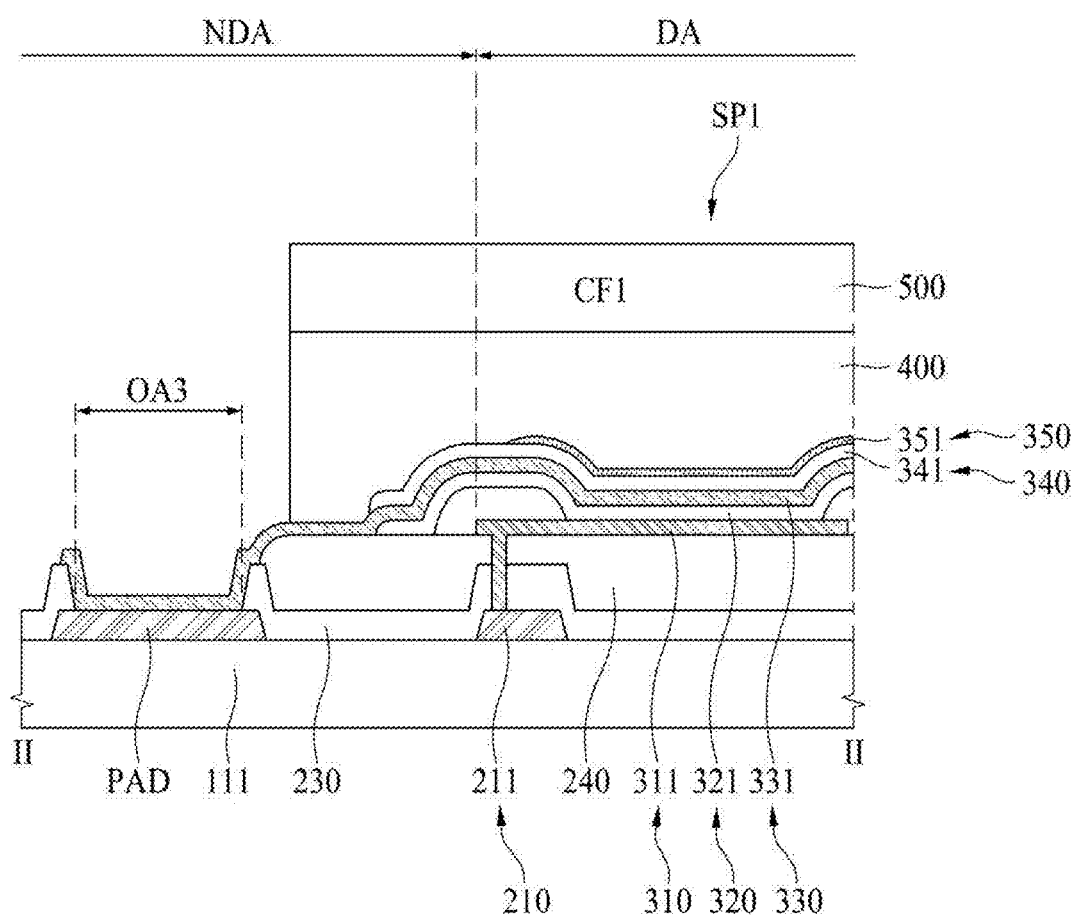
FIG. 7 is a cross-sectional view illustrating an example of line II-II in FIG. 2.
Figure 8:
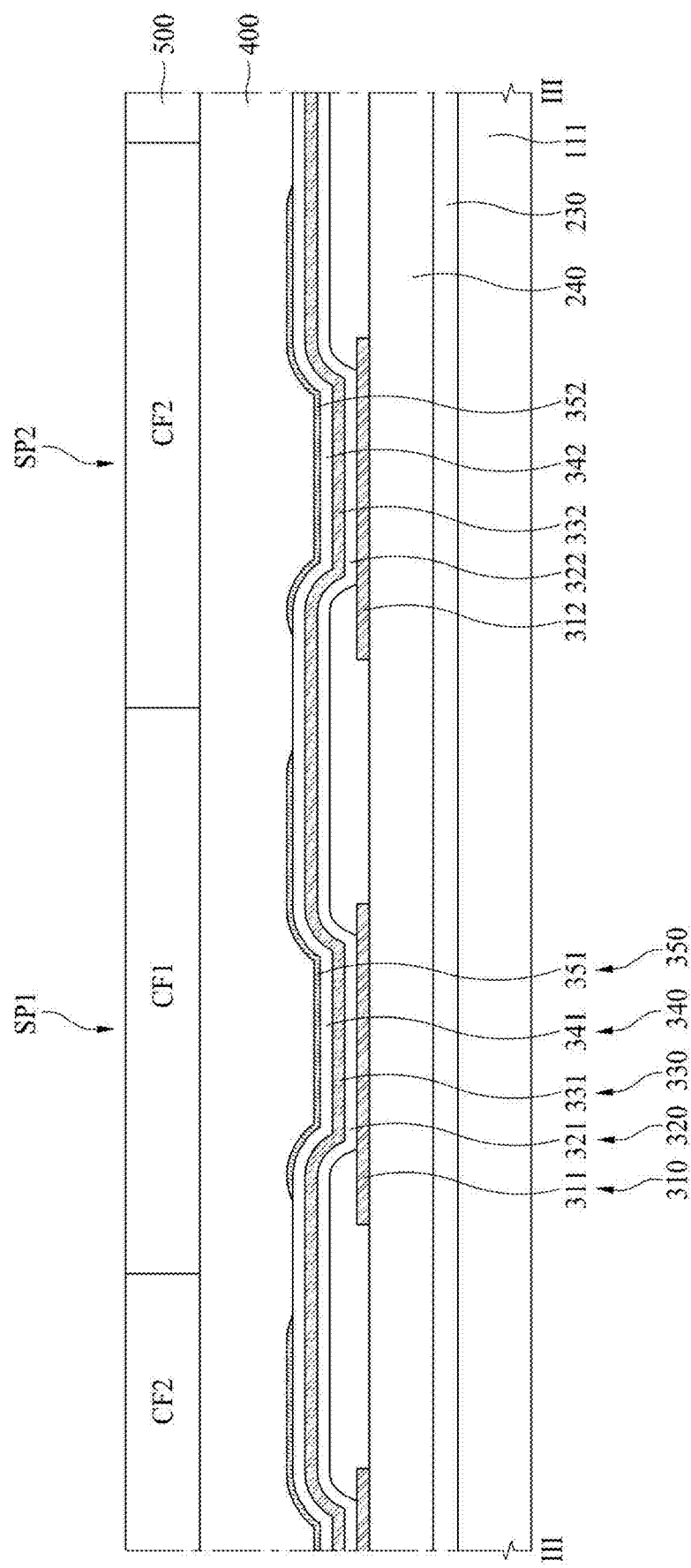
FIG. 8 is a cross-sectional view illustrating an example of line III-III in FIG. 3.
Figure 9:
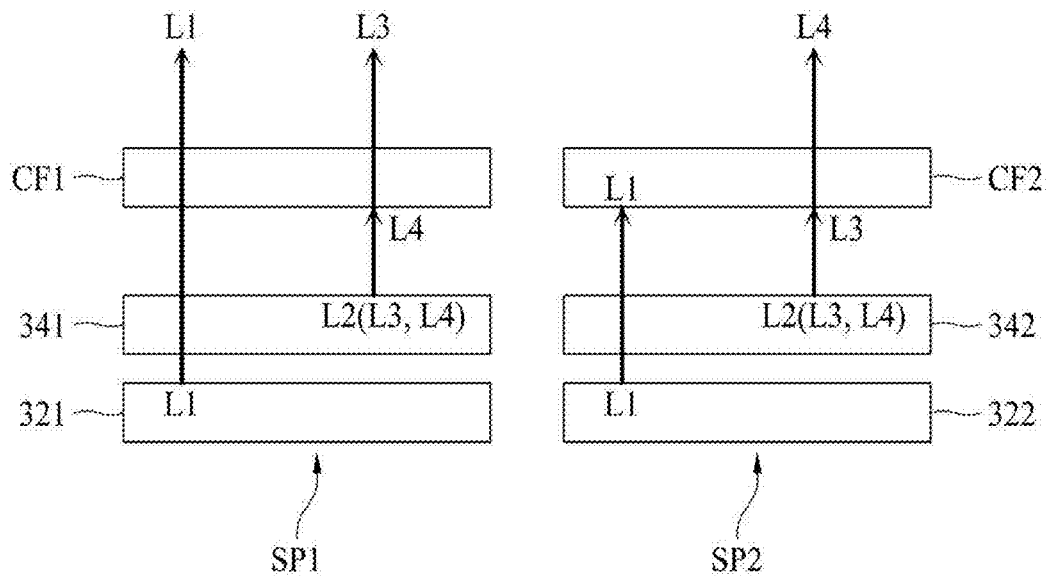
FIG. 9 illustrates light that has passed through a first color filter and a second color filter.
Figure 10:
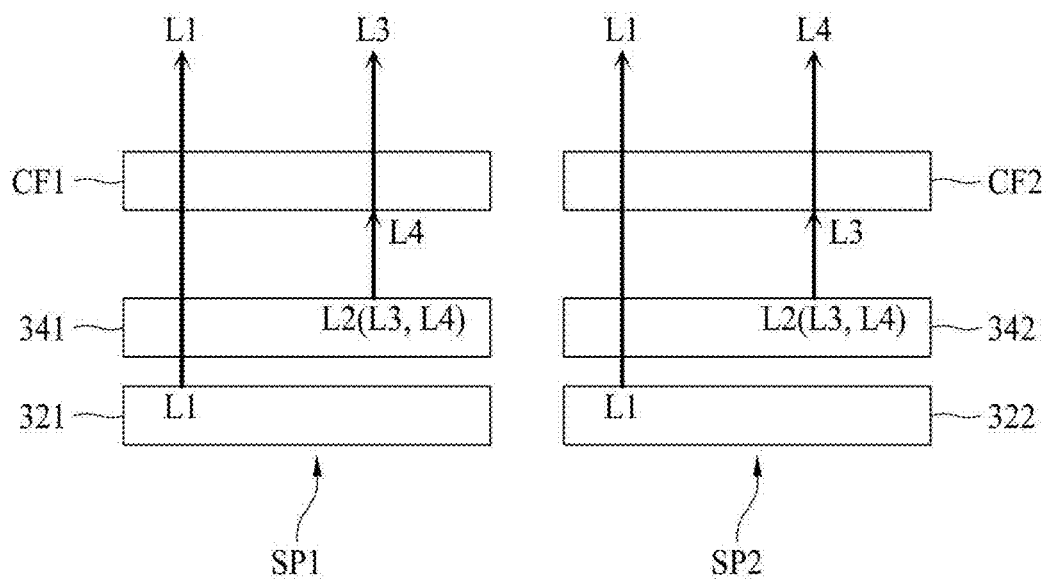
FIG. 10 illustrates another example of light that has passed through a first color filter and a second color filter.

FIG. 2 illustrates a first substrate of a display panel according to one example embodiment of the present disclosure. FIG. 3 illustrates an example of a first sub-pixel and a second sub-pixel. FIG. 4 is a cross-sectional view illustrating an example of line I-I in FIG. 2. FIG. 5 is an enlarged view illustrating an example of an area A in FIG. 4. FIG. 6 is a cross-sectional view illustrating an example of a first electrode and a light-emitting layer in a display device according to one example embodiment of the present disclosure. FIG. 7 is a cross-sectional view illustrating an example of line II-II in FIG. 2. FIG. 8 is a cross-sectional view illustrating an example of line III-III in FIG. 3. FIG. 9 illustrates light that has passed through a first color filter and a second color filter. FIG. 10 illustrates another example of light that has passed through a first color filter and a second color filter.

As illustrated in FIGS. 2 to 10, the display panel 110 according to one example embodiment of the present disclosure includes: a first substrate 111, a first driving transistor 210, a second driving transistor 220, an insulating film 230, a planarization film 240, a mask pattern 260, a bank 250, a first electrode 310, a first light-emitting layer 320, a second electrode 330, a second light-emitting layer 340, a third electrode 350, an encapsulation layer 400, and a color filter 500. The first substrate 111 may be made of glass or plastic, a semiconductor material such as a silicon wafer, and/or a transparent material or an opaque material.

The first substrate 111 is categorized into the display area DA and the non-display area NDA. A plurality of pixels P may be provided on the display area of the first substrate 111. Each pixel P may include a first sub-pixel SP1 and a second sub-pixel SP2. The first sub-pixel SP1 and the second sub-pixel SP2 may be provided to emit light of at least three colors. For example, the first sub-pixel SP1 may be provided to emit blue light and green light, and the second sub-pixel SP2 may be provided to emit red light. For another example, the first sub-pixel SP1 may be provided to emit blue light and green light, and the second sub-pixel SP2 may be provided to emit blue light and red light. If light emitted from the first sub-pixel SP1 is mixed with light emitted from the second sub-pixel P2, white light may be obtained.

The display device 100 according to one example embodiment of the present disclosure may be provided in a top emission type in which light is emitted upwardly. If the display device 100 according to one example embodiment of the present disclosure is provided in a top emission type in which light is emitted upwardly, not only a transparent material but also an opaque material may be used as the first substrate 111. On the other hand, if the display device 100 according to one example embodiment of the present disclosure is provided in a bottom emission type in which light is emitted downwardly, a transparent material may be used as the first substrate 111.

A circuit diode that includes various signal lines, a driving transistor and a capacitor is provided on the first substrate 111 for each of the sub-pixels SP1 and SP2. The signal lines may include a gate line, a data line, a power line, and a reference line. The display device 100 according to one example embodiment of the present disclosure includes a first driving transistor 210 and a second driving transistor 220 for each of the first sub-pixel SP1 and the second sub-pixel SP2. A first driving transistor 211 and a second driving transistor 221 may be provided in the first sub-pixel SP1, and another first driving transistor 212 and another second driving transistor 222 may be provided in the second sub-pixel SP2. Different signals per sub-pixels SP1 and SP2 may be applied to the first driving transistors 211 and 212 and the second driving transistors 221 and 222.

The first driving transistors 211 and 212 may supply a predetermined voltage to first electrodes 311 and 312 in accordance with the data voltage of the data line if the gate signal is input to the gate line. The second driving transistors 221 and 222 may supply a predetermined voltage to third electrodes 351 and 352 in accordance with the data voltage of the data line if the gate signal is input to the gate line.

Each of the first driving transistors 211 and 212 and the second driving transistors 221 and 222 may include an active layer, a gate electrode, a source electrode, and a drain electrode. Although the first driving transistors 211 and 212 and the second driving transistors 221 and 222 are formed in a top gate mode in which the gate electrode is arranged above the active layer, the driving transistor of the present disclosure is not limited to the top gate mode. That is, the first driving transistors 211 and 212 and the second driving transistors 221 and 222 may be formed in a bottom gate mode in which the gate electrode is arranged below the active layer or a double gate mode in which the gate electrode is arranged above and below the active layer.

An active layer may be provided on the first substrate 111. The active layer may be made of a silicon-based semiconductor material or an oxide-based semiconductor material. A light-shielding layer for shielding external light entering the active layer may be provided between the first substrate 111 and the active layer. A gate insulating film may be provided on the active layer. The gate insulating film may be made of an inorganic film such as a silicon oxide film, a silicon nitride film, or a multi-layered film of the silicon oxide film and the silicon nitride film. The gate electrode may be provided on the gate insulating film. The gate electrode may be made of a single layer or multiple layers including any one of Mo, Al, Cr, Au, Ti, Ni, Nd, and Cu and/or any one of their alloy(s).

An inter-layer dielectric film may be provided on the gate electrode. The inter-layer dielectric film may be made of an inorganic film such as a silicon oxide film, a silicon nitride film, or a multi-layered film of the silicon oxide film and the silicon nitride film. The source electrode and the drain electrode may be provided on the inter-layer dielectric film. Each of the source electrode and the drain electrode may be connected to the active layer through a contact hole that passes through the gate insulating film and the inter-layer dielectric film. Each of the source electrode and the drain electrode may be made of a single layer or multiple layers including any one of Mo, Al, Cr, Au, Ti, Ni, Nd, and Cu and/or their alloy(s).

The insulating film 230 is provided on the first driving transistors 211 and 212 and the second driving transistors 221 and 222. The insulating film 230 covers the first driving transistors 211 and 212, thereby protecting the first driving transistors 211 and 212. The insulating film 230 may partially expose the second driving transistors 221 and 222, the source electrode, and/or the drain electrode of the second driving transistors 221 and 222. The insulating film 230 includes opening areas OA1, OA2, and OA3 that partially expose the source electrode or the drain electrode of the second driving transistors 221 and 222.

The insulating film 230 may include a first opening area OA1 for partially exposing the one second driving transistor 221, and a second opening area OA2 for partially exposing the other second driving transistor 222. Also, the insulating film 230 may include a third opening area OA3 for partially exposing a pad PAD. The insulating film 230 may be made of an inorganic film such as a silicon oxide film, a silicon nitride film, or a multi-layered film of the silicon oxide film and the silicon nitride film.

The planarization film 240 may be provided on the insulating film 230 to planarize a step difference due to the first driving transistors 211 and 212. The planarization film 240 may not provided on the opening areas OA1, OA2, and OA3 of the insulating film 230. Therefore, a part of the source electrode or the drain electrode of the second driving transistors 221 and 222 may still be exposed. The planarization film 240 may have a formation area smaller than the insulating film 230. Therefore, the planarization film 240 may partially expose the insulating film 230. The insulating film 230 may be exposed in an area adjacent to the opening areas OA1, OA2, and OA3 without being covered by the planarization film 240. The planarization film 240 may be made of an organic film such as acrylic resin, epoxy resin, phenolic resin, polyamide resin, and polyimide resin.

The first electrode 310 may be provided on the planarization film 240 for each of the sub-pixels SP1 and SP2. The first electrode 310 may be formed to be patterned on the planarization film 240 for each of the sub-pixels SP1 and SP2. One first electrode 311 may be formed on the first sub-pixel SP1, and another first electrode 312 may be formed on the second sub-pixel SP2. The first electrodes 311 and 312 are connected to the source electrode or the drain electrode of the first driving transistors 211 and 212 through contact holes CH1 and CH2 that pass through the insulating film 230 and the planarization film 240.

The first electrodes 311 and 312 may be formed of a transparent metal material, a semi-transmissive metal material, and/or a metal material with high reflexibility. If the display device 100 is formed of a top emission type, the first electrodes 311 and 312 may be formed of a metal material with high reflexibility. For example, the first electrodes may be formed of a deposition structure (Ti/Al/Ti) of Al and Ti, a deposition structure (ITO/Al/ITO) of Al and ITO, an Ag alloy, and/or a deposition structure (ITO/Ag alloy/ITO) of Ag alloy and ITO. The Ag alloy may be an alloy of Ag, Pd, and/or Cu. If the display device 100 is formed in a bottom emission type, the first electrodes 311 and 312 may be formed of a transparent conductive material (TCO) such as ITO and IZO that may transmit light, a semi-transmissive conductive material such as Mg or Ag, and/or an alloy of Mg or Ag. The first electrodes 311 and 312 may be anode electrodes.

The mask pattern 260 may be provided on the insulating film 230 to partially cover the opening areas OA1 and OA2 of the insulating film 230. The mask pattern 260 includes a first mask pattern 261 and a second mask pattern 262. The first mask pattern 261 is provided at one side of the first sub-pixel SP1 or the second sub-pixel SP2, e.g., a side where the first opening area OA1 is arranged. The first mask pattern 261 includes a protrusion 261a provided on the insulating film 230 exposed without being covered by the planarization film 240, extending from the insulating film 230 and protruded to partially cover the first opening area OA1. The protrusion 261a of the first mask pattern 261 may be spaced apart from the source electrode or the drain electrode of the second driving transistor 221 to provide a space with the source electrode or the drain electrode of the second driving transistor 221.

The first mask pattern 261 may be close to the second sub-pixel SP2 arranged to adjoin the first sub-pixel SP1 by interposing the first opening area OA1. The first mask pattern 261 may protrude such that the protrusion 261a is headed for the first opening area OA1 from the second sub-pixel SP2. Therefore, a partial area adjacent to the second sub-pixel SP2 of the first opening area OA1 is covered by the first mask pattern 261. A partial area of the source electrode or the drain electrode of the second driving transistor 221 may be covered by the first mask pattern 261. The source electrode or the drain electrode of the second driving transistor 221 may be exposed in the other area adjacent to the first sub-pixel SP1 of the first opening area OA1. The first mask pattern 261 may be provided between the first sub-pixel SP1 and the second sub-pixel SP2 in a pattern having a predetermined length in a second direction (Y-axis direction). The first mask pattern 261 may have a length shorter than that of each of the first sub-pixel SP1 and the second sub-pixel SP2 in the second direction.

As illustrated in FIGS. 4 and 5, the first mask pattern 261 may be on the same layer as the first electrodes 311 and 312. The first mask pattern 261 may be made of the same material as that of the first electrodes 311 and 312. The first mask pattern 261 may be spaced apart from the first electrodes 311 and 312. The first mask pattern 261 is spaced apart from the first electrode 312 of the second sub-pixel SP2 such that it is not electrically connected with the first electrode 312 of the second sub-pixel SP2. The first mask pattern 261 may be formed on the planarization film 240 as well as the insulating film 230 exposed without being covered by the planarization film 240.

In the display device 100, the first mask pattern 261 may be made of the same material as that of the first electrodes 311 and 312 on the same layer as the first electrodes 311 and 312. As a result, the first mask pattern 261 may be formed without adding a separate process. However, the first mask pattern 261 may be formed on a layer different from the first electrodes 311 and 312. The first mask pattern 261 may be formed between the insulating film 230 and the planarization film 240.

The second mask pattern 262 may be provided at one side of the first sub-pixel SP1 or the second sub-pixel SP2, e.g., a side where the second opening area OA2 is arranged. The second mask pattern 262 includes a protrusion 262a formed on the insulating film 230 exposed without being covered by the planarization film 240, extending from the insulating film 230 and protruded to partially cover the second opening area OA2. The protrusion 262a of the second mask pattern 262 may be spaced apart from the source electrode or the drain electrode of the second driving transistor 222 to provide a space with the source electrode or the drain electrode of the second driving transistor 222.

The second mask pattern 262 may be close to the first sub-pixel SP1 arranged to adjoin the second sub-pixel SP2 by interposing the second opening area OA2. The second mask pattern 262 may protrude such that the protrusion 262a is headed for the second opening area OA2 from the first sub-pixel SP1. Therefore, a partial area adjacent to the first sub-pixel SP1 of the second opening area OA2 may be covered by the second mask pattern 262. A partial area of the source electrode or the drain electrode of the second driving transistor 222 may also be covered by the second mask pattern 262. The source electrode or the drain electrode of the second driving transistor 222 may be exposed in the other area adjacent to the second sub-pixel SP2 of the second opening area OA2. The second mask pattern 262 may be provided between the first sub-pixel SP1 and the second sub-pixel SP2 in a pattern having a predetermined length in a second direction (Y-axis direction). The length of the second mask pattern 262 in the second direction is shorter than that of each of the first sub-pixel SP1 and the second sub-pixel SP2 in the second direction.

As illustrated in FIGS. 4 and 5, the second mask pattern 262 may be on the same layer as the first electrodes 311 and 312. The second mask pattern 262 may be made of the same material as that of the first electrodes 311 and 312. The second mask pattern 262 may be spaced apart from the first electrodes 311 and 312. The second mask pattern 262 may be spaced apart from the first electrode 312 of the first sub-pixel SP1 such that it is not electrically connected with the first electrode 311 of the first sub-pixel SP1. The second mask pattern 262 may be formed on the planarization film 240 as well as the insulating film 230 exposed without being covered by the planarization film 240. In the display device 100, the second mask pattern 262 may be made of the same material as that of the first electrodes 311 and 312 on the same layer as the first electrodes 311 and 312. As a result, the second mask pattern 262 may be formed without adding a separate process. However, the second mask pattern 262 may be formed on a layer different from the first electrodes 311 and 312. The second mask pattern 262 may be formed between the insulating film 230 and the planarization film 240.

The bank 250 may be provided on the planarization film 240 to cover ends of the first electrodes 311 and 312. Therefore, luminance efficiency may deteriorate due to a current concentrated on the ends of the first electrodes 311 and 312. The bank 250 may not be provided on the opening areas OA1, OA2, and OA3 of the insulating film 230. Therefore, a partial portion of the source electrode or the drain electrode of the second driving transistors 221 and 222 may still be exposed. Also, the bank 250 may be provided on the mask patterns 261 and 262. The bank 250 may be provided such that the protrusions 261a and 262a of the mask patterns 261 and 262 may be exposed without being covered.

If the bank 250 covers the protrusions 261a and 262a of the mask patterns 261 and 262, the first light-emitting layers 321 and 322 of the sub-pixels SP1 and SP2 may be connected with each other without being disconnected in the opening areas OA1 and OA2. Also, the second electrodes 331 and 332 of the sub-pixels SP1 and SP2 may be connected with each other without being disconnected in the opening areas OA1 and OA2. Therefore, a problem may occur in that the third electrode 351 of the first sub-pixel SP1 is connected to the source electrode or the drain electrode of the second driving transistor 221. Also, the third electrode 352 of the second sub-pixel may be connected to the source electrode or the drain electrode of the second driving transistor 222. In the display device 100 according to one example embodiment of the present disclosure, the bank 250 should expose the protrusions 261a and 262a of the mask patterns 261 and 262 without covering them.

The bank 250 defines a luminance area in each of the plurality of sub-pixels SP1 and SP2. That is, the bank 250 is not provided in each of the sub-pixels SP1 and SP2, and the exposed area of the first electrodes 311 and 312 becomes a luminance area. Although the bank 250 may be made of a relatively thin inorganic insulating film, the bank 250 may be made of a relatively thick organic insulating film.

The first light-emitting layers 321 and 322 are provided on the first electrodes 311 and 312. The first light-emitting layers 321 and 322 may be provided on the bank 250. The first light-emitting layers 321 and 322 may be formed by sequentially depositing a hole injecting layer (HIL), a hole transporting layer (HTL), a first color-emitting layer EML1, an electron transporting layer (ETL), and an electron injecting layer (EIL) on the first electrodes 311 and 312, as illustrated in FIG. 6. The holes and the electrons of the first light-emitting layers 321 and 322 may respectively move to the first color-emitting layer through the hole transporting layer and the electron transporting layer, and may be combined in the first color-emitting layer to emit a predetermined colored light.

Each of the first light-emitting layers 321 and 322 may be at least one of: a red light-emitting layer for emitting red light, a green light-emitting layer for emitting green light, a blue light-emitting layer for emitting blue light, a yellow light-emitting layer for emitting yellow light, a cyan light-emitting layer for emitting cyan light, a magenta light-emitting layer for emitting magenta light and an orange light-emitting layer for emitting orange light. The first light-emitting layers 321 and 322 may be disconnected between the first sub-pixel SP1 and the second sub-pixel SP2. The mask patterns 261 and 262 are provided between the first sub-pixel SP1 and the second sub-pixel SP2. The first light-emitting layers 321 and 322 may be disconnected from each other by the mask patterns 261 and 262.

The first light-emitting layers 321 and 322 may be disconnected between the first sub-pixel SP1 and the second sub-pixel SP2 by the first mask pattern 261. If the first light-emitting layers 321 and 322 are deposited on the entire surface without a mask, the first light-emitting layer 322 deposited on the second sub-pixel SP2 may be disconnected on the protrusion 261a of the first mask pattern 261. This is due to a step difference between the protrusion 261a of the first mask pattern 261 and the second driving transistor 221, as illustrated in FIG. 4. The first light-emitting layer 321 deposited on the first sub-pixel SP1 may be provided on the second driving transistor 221 exposed without being covered by the protrusion 261a of the first mask pattern 261, as illustrated in FIGS. 4 and 5.

Also, the first light-emitting layers 321 and 322 may be disconnected between the first sub-pixel SP1 and the second sub-pixel SP2 by the second mask pattern 262. If the first light-emitting layers 321 and 322 are deposited on the entire surface without a mask, the first light-emitting layer 321 deposited on the first sub-pixel SP1 may be disconnected on the protrusion 262a of the second mask pattern 262. This is due to a step difference between the protrusion 262a of the second mask pattern 262 and the second driving transistor 222, as illustrated in FIG. 4. The first light-emitting layer 322 deposited on the second sub-pixel SP2 may be provided on the second driving transistor 222 without being covered by the protrusion 262a of the second mask pattern 262, as illustrated in FIGS. 4 and 5.

In the display device 100 according to one example embodiment of the present disclosure, the first light-emitting layer 321 of the first sub-pixel SP1 and the first light-emitting layer 322 of the second sub-pixel SP2 may be disconnected from each other without adjoining each other in the opening areas OA1 and OA2. For this reason, if the second electrodes 331 and 332, the second light-emitting layers 341 and 342 and the third electrodes 351 and 352 are sequentially deposited on the first light-emitting layers 321 and 322, a space where the third electrode 351 deposited on the first sub-pixel SP1 may enter between the protrusion 261a of the first mask pattern 261 and the second driving transistor 221. Also, a space where the third electrode 352 deposited on the second sub-pixel SP2 may enter between the protrusion 262a of the second mask pattern 262 and the second driving transistor 222.

The second electrodes 331 and 332 are provided on the first light-emitting layers 321 and 322. The second electrodes 331 and 332 may be disconnected between the first sub-pixel SP1 and the second sub-pixel SP2. The mask patterns 261 and 262 are provided between the first sub-pixel SP1 and the second sub-pixel SP2. The second electrodes 331 and 332 may be disconnected from each other by the mask patterns 261 and 262.

The second electrodes 331 and 332 may be disconnected between the first sub-pixel SP1 and the second sub-pixel SP2 by the first mask pattern 261. If the second electrodes 331 and 332 are deposited on the entire surface, the second electrode 332 deposited on the second sub-pixel SP2 may be disconnected on the protrusion 261a of the first mask pattern 261. This is due to the step difference between the protrusion 261a of the first mask pattern 261 and the second driving transistor 221, as illustrated in FIG. 4. The second electrode 331 deposited on the first sub-pixel SP1 may be provided on the first light-emitting layer 321 exposed without being covered by the protrusion 261a of the first mask pattern 261, as illustrated in FIGS. 4 and 5.

Also, the second electrodes 331 and 332 may be disconnected between the first sub-pixel SP1 and the second sub-pixel SP2 by the second mask pattern 262. If the second electrodes 331 and 332 are deposited on the entire surface without a mask, the second electrode 331 deposited on the first sub-pixel SP1 may be disconnected on the protrusion 262a of the second mask pattern 262. This is due to the step difference between the protrusion 262a of the second mask pattern 262 and the second driving transistor 222, as illustrated in FIG. 4. The second electrode 332 deposited on the second sub-pixel SP2 may be provided on the first light-emitting layer 322 exposed without being covered by the protrusion 262a of the second mask pattern 262, as illustrated in FIGS. 4 and 5.

In the display device 100 according to one example embodiment of the present disclosure, the second electrode 331 of the first sub-pixel SP1 and the second electrode 332 of the second sub-pixel SP2 may be disconnected from each other without adjoining each other in the opening areas OA1 and OA2. For this reason, if the second light-emitting layers 341 and 342 and the third electrodes 351 and 352 are sequentially deposited on the second electrodes 331 and 332, the space where the third electrode 351 deposited on the first sub-pixel SP1 may enter between the protrusion 261a of the first mask pattern 261 and the second driving transistor 221. Also, the space where the third electrode 352 deposited on the second sub-pixel SP2 may enter between the protrusion 262a of the second mask pattern 262 and the second driving transistor 222.

Also, in the display device 100 according to one example embodiment of the present disclosure, the second electrode 331 of the first sub-pixel SP1 and the second electrode 332 of the second sub-pixel SP2 may not be connected with the second driving transistors 221 and 222 in the opening areas OA1 and OA2. The second electrode 331 of the first sub-pixel SP1 and the second electrode 332 of the second sub-pixel SP2 may be formed using an evaporation instead of a physics vapor deposition such as sputtering. This is because the second electrode 331 of the first sub-pixel SP1 and the second electrode 332 of the second sub-pixel SP2 may be connected to the second driving transistors 221 and 222 as a film formed by physics vapor deposition such as sputtering. This process has excellent step coverage characteristics.

In the area where the mask patterns 261 and 262 and the opening areas OA1 and OA2 are not formed, the second electrodes 331 and 332 may be connected between the first sub-pixel SP1 and the second sub-pixel SP2, as illustrated in FIG. 8. Therefore, the second electrodes 331 and 332 may be cathode electrodes, and may commonly supply a low potential voltage applied to the pad PAD to the first sub-pixel SP1 and the second sub-pixel SP2. The second electrodes 331 and 332 may be formed of a transparent conductive material (TCO) such as ITO and IZO that may transmit light, a semi-transmissive conductive material such as Mg or Ag, and/or an alloy of Mg or Ag. The second electrodes 331 and 332 may be cathode electrodes.

The second light-emitting layers 341 and 342 are provided on the second electrodes 331 and 332. The second light-emitting layers 341 and 342 may be formed by sequentially depositing an electron injecting layer (EIL), an electron transporting layer (ETL), a second color-emitting layer EML2, a hole transporting layer (HTL), and a hole injecting layer (HIL) on the second electrodes 331 and 332, as illustrated in FIG. 6. The holes and the electrons of the second light-emitting layers 341 and 342 may respectively move to the second color-emitting layer through the hole transporting layer and the electron transporting layer, and are combined in the second color-emitting layer to emit a predetermined colored light. Each of the second light-emitting layers 341 and 342 may be at least one of: a red light-emitting layer for emitting red light, a green light-emitting layer for emitting green light, a blue light-emitting layer for emitting blue light, a yellow light-emitting layer for emitting yellow light, a cyan light-emitting layer for emitting cyan light, a magenta light-emitting layer for emitting magenta light, and an orange light-emitting layer for emitting orange light.

However, the second light-emitting layers 341 and 342 may emit light of a color different from that of the first light-emitting layers 321 and 322. The first light-emitting layers 321 and 322 may include a first color-emitting layer for emitting first colored light, and the second light-emitting layers 341 and 342 may include a second color-emitting layer for emitting second colored light. Any one of the first colored light and the second colored light may be mixed light of two different colors. For example, the first light-emitting layers 321 and 322 may be yellow light-emitting layers for emitting yellow light that is mixed light of green and red, and the second light-emitting layers 341 and 342 may be blue light-emitting layers for emitting blue light. On the contrary, the second light-emitting layers 341 and 342 may be yellow light-emitting layers for emitting yellow light that is mixed light of green and red, and the first light-emitting layers 321 and 322 may be blue light-emitting layers for emitting blue light.

The second light-emitting layers 341 and 342 may be disconnected between the first sub-pixel SP1 and the second sub-pixel SP2. The mask patterns 261 and 262 are provided between the first sub-pixel SP1 and the second sub-pixel SP2. The second light-emitting layers 341 and 342 may be disconnected from each other by the mask patterns 261 and 262. The second light-emitting layers 341 and 342 may be disconnected between the first sub-pixel SP1 and the second sub-pixel SP2 by the first mask pattern 261. If the second light-emitting layers 341 and 342 are deposited on the entire surface without a mask, the second light-emitting layer 342 deposited on the second sub-pixel SP2 may be disconnected on the protrusion 261a of the first mask pattern 261. This is due to a step difference between the protrusion 261a of the first mask pattern 261 and the second driving transistor 221, as illustrated in FIG. 4. The second light-emitting layer 341 deposited on the first sub-pixel SP1 may be provided on the second driving transistor 221 exposed without being covered by the protrusion 261a of the first mask pattern 261, as illustrated in FIGS. 4 and 5.

Also, the second light-emitting layers 341 and 342 may be disconnected between the first sub-pixel SP1 and the second sub-pixel SP2 by the second mask pattern 262. If the second light-emitting layers 341 and 342 are deposited on the entire surface without a mask, the second light-emitting layer 341 deposited on the first sub-pixel SP1 may be disconnected on the protrusion 262a of the second mask pattern 262. This is due to the step difference between the protrusion 262a of the second mask pattern 262 and the second driving transistor 222, as illustrated in FIG. 4. The second light-emitting layer 342 deposited on the second sub-pixel SP2 may be provided on the second driving transistor 222 exposed without being covered by the protrusion 262a of the second mask pattern 262, as illustrated in FIGS. 4 and 5.

In the display device 100 according to one example embodiment of the present disclosure, the second light-emitting layer 341 of the first sub-pixel SP1 and the second light-emitting layer 342 of the second sub-pixel SP2 are disconnected from each other without adjoining each other in the opening areas OA1 and OA2. For this reason, if the third electrodes 351 and 352 are deposited on the second light-emitting layers 341 and 342, the space where the third electrode 351 deposited on the first sub-pixel SP1 may enter between the protrusion 261a of the first mask pattern 261 and the second driving transistor 221. Also, the space where the third electrode 352 deposited on the second sub-pixel SP2 may enter between the protrusion 262a of the second mask pattern 262 and the second driving transistor 222.

The third electrodes 351 and 352 are provided on the second light-emitting layers 341 and 342. The third electrodes 351 and 352 may be disconnected between the first sub-pixel SP1 and the second sub-pixel SP2. The mask patterns 261 and 262 are provided between the first sub-pixel SP1 and the second sub-pixel SP2. The third electrodes 351 and 352 may be disconnected from each other by the mask patterns 261 and 262.

The third electrodes 351 and 352 may be disconnected between the first sub-pixel SP1 and the second sub-pixel SP2 by the first mask pattern 261. If the third electrodes 351 and 352 are deposited on the entire surface, the third electrode 352 deposited on the second sub-pixel SP2 may be disconnected on the protrusion 261a of the first mask pattern 261. This is due to the step difference between the protrusion 261a of the first mask pattern 261 and the second driving transistor 221, as illustrated in FIG. 4.

The third electrode 351 deposited on the first sub-pixel SP1 may enter the space between the protrusion 261a of the first mask pattern 261 and the second light-emitting layer 341, as illustrated in FIGS. 4 and 5. Therefore, the third electrode 351 may be formed below the protrusion 261a of the first mask pattern 261. The third electrode 351 deposited on the first sub-pixel SP1 may be formed by a physics vapor deposition such as sputtering. A film formed by the physics vapor deposition such as sputtering has excellent step coverage characteristics. As such, the third electrode 351 may be deposited below the protrusion 261a of the first mask pattern 261 at an area wider than the first light-emitting layer 321, the second electrode 331, and the second light-emitting layer 341. Therefore, the third electrode 351 of the first sub-pixel SP1 may be connected to the source electrode or the drain electrode of the second driving transistor 221.

Also, the third electrodes 351 and 352 may be disconnected between the first sub-pixel SP1 and the second sub-pixel SP2 by the second mask pattern 262. If the third electrodes 351 and 352 are deposited on the entire surface, the third electrode 351 deposited on the first sub-pixel SP1 may be disconnected on the protrusion 262a of the second mask pattern 262. This is due to the step difference between the protrusion 262a of the second mask pattern 262 and the second driving transistor 222, as illustrated in FIG. 4.

The third electrode 352 deposited on the second sub-pixel SP2 may enter the space between the protrusion 262a of the second mask pattern 262 and the second light-emitting layer 342, as illustrated in FIGS. 4 and 5. Therefore, the third electrode 351 may be formed below the protrusion 262a of the second mask pattern 262. The third electrode 352 deposited on the second sub-pixel SP2 may be formed by a physics vapor deposition such as sputtering. Because a film formed by the physics vapor deposition such as sputtering has excellent step coverage characteristics, the third electrode 352 may be deposited below the protrusion 262a of the second mask pattern 262 at an area wider than the first light-emitting layer 322, the second electrode 332, and the second light-emitting layer 342. Therefore, the third electrode 352 of the second sub-pixel SP2 may be connected to the source electrode or the drain electrode of the second driving transistor 222.

The third electrodes 351 and 352 may be formed of a transparent metal material, a semi-transmissive metal material, and/or a metal material with high reflexibility. If the display device 100 is formed in a top emission type, the third electrodes 351 and 352 may be formed of a transparent conductive material (TCO) such as ITO and IZO that may transmit light, a semi-transmissive conductive material such as Mg or Ag, and/or an alloy of Mg or Ag. If the display device 100 is formed in a bottom emission type, the third electrodes 351 and 352 may be formed of a metal material with high reflexibility such as a deposition structure (Ti/Al/Ti) of Al and Ti, a deposition structure (ITO/Al/ITO) of Al and ITO, an Ag alloy, and/or a deposition structure (ITO/Ag alloy/ITO) of Ag alloy and ITO. The Ag alloy may be an alloy of Ag, Pd, and/or Cu. The third electrodes 351 and 352 may be anode electrodes.

The encapsulation layer 400 may be provided on the third electrode 350 to prevent external water from permeating into the first light-emitting layer 320 and the second light-emitting layer 340. The encapsulation layer 400 may be made of an inorganic insulating material or a structure in which an inorganic material and an organic material are deposited alternately. Although not illustrated in FIG. 4, a capping layer may additionally be provided between the third electrode 350 and the encapsulation layer 400.

The color filter 500 may be patterned for each of the sub-pixels SP1 and SP2. The color filter 500 may include a first color filter CF1 arranged to correspond to the first sub-pixel SP1 and a second color filter CF2 arranged to correspond to the second sub-pixel SP2. Each of the first color filter CF1 and the second color filter CF2 may allow each of the first sub-pixel SP1 and the second sub-pixel SP2 to emit only light of a specific wavelength range by absorbing light of a predetermined wavelength range from light emitted from at least one of the first light-emitting layer 320 and the second light-emitting layer 340. Each of the first color filter CF1 and the second color filter CF2 may be formed of a material known in the art, such as a dye, pigment, quantum dot, nanoparticle, resin or dielectric, that absorbs light of a specific wavelength range.

Each of the first color filter CF1 and the second color filter CF2 may absorb at least one of light of a blue wavelength range, light of a green wavelength range, and light of a red wavelength range, and/or may transmit light of other wavelength ranges. The light transmitted from each of the first color filter CF1 and the second color filter CF2 may include light of the blue wavelength range, light of the green wavelength range, and light of the red wavelength range.

For example, the first light-emitting layers 321 and 322 may emit light L1 of the first color, and the second light-emitting layers 341 and 344 may emit the mixed light L2 of the second color and the third color. The first color filter CF1 may include a third material adapted to absorb light of the third color. The first color filter CF1 may include a pigment or dye that absorbs light of the third color wavelength range. As illustrated in FIG. 9, the first color filter CF1 may absorb light L4 of the third color wavelength range, and may transmit light L1 of the first color wavelength range and light L3 of the second color wavelength range. Therefore, the first sub-pixel SP1 may emit the light L1 of the first color and the light L3 of the second color.

The second color filter CF2 may include a first material adapted to absorb light of the first color and a second material adapted to absorb light of the second color. The second color filter CF2 may include a pigment or dye that absorbs light of the first color wavelength range, and may include a pigment or dye that absorbs light of the second color wavelength range. As illustrated in FIG. 9, the second color filter CF2 may absorb light L1 of the first color wavelength range and light L3 of the second color wavelength range, and may transmit only light L4 of the third color wavelength range. Therefore, the second sub-pixel SP2 may emit only the third color light L4. The light of the first color may be blue light, the light of the second color may be green light, and the light of the third color may be red light.

For another example, the first light-emitting layers 321 and 322 may emit light L1 of the first color, and the second light-emitting layers 341 and 344 may emit the mixed light L2 of the second color and the third color. The first color filter CF1 may include a third material adapted to absorb light of the third color. The first color filter CF1 may include a pigment or dye that absorbs light of the third color wavelength range. As illustrated in FIG. 10, the first color filter CF1 may absorb light L4 of the third color wavelength range, and may transmit light L1 of the first color wavelength range and light L3 of the second color wavelength range. Therefore, the first sub-pixel SP1 may emit the light L1 of the first color and the light L3 of the second color.

The second color filter CF2 may include a second material adapted to absorb light of the second color. The second color filter CF2 may include a pigment or dye that absorbs light of the second color wavelength range. As illustrated in FIG. 10, the second color filter CF2 may absorb light L3 of the second color wavelength range, and may transmit light L1 of the first color wavelength range and light L4 of the third color wavelength range. Therefore, the second sub-pixel SP2 may emit the light L1 of the first color and the light L4 of the third color. The light of the first color may be blue light, the light of the second color may be green light, and the light of the third color may be red light. As a result, although one pixel P includes two sub-pixels SP1 and SP2 only, the blue light L1, the green light L3 and the red light L4, that is, light of three colors may be emitted from the two sub-pixels SP1 and SP2.

The color filter 500 may be arranged below the first electrode 310 or on the third electrode 350 in accordance with an emission type of the display device 100. If the display device 100 corresponds to the top emission type, the color filter 500 may be provided on the third electrode 350, as illustrated in FIG. 4. If the display device 100 corresponds to the bottom emission type, the color filter 500 may be provided below the first electrode 310.

The first light-emitting layers 321 and 322 and the second light-emitting layers 341 and 342 may emit light independently from each of the sub-pixels SP1 and SP2. If a first high potential voltage is applied from the first driving transistors 211 and 212 to the first electrodes 311 and 312 and a low potential voltage is applied from the pad PAD to the second electrodes 331 and 332, the first light-emitting layers 321 and 322 provided between the first electrodes 311 and 312 and the second electrodes 331 and 332 emit light with predetermined brightness in accordance with a predetermined current. In the sub-pixels SP1 and SP2, if a second high potential voltage is applied from the second driving transistors 221 and 222 to the third electrodes 351 and 352 and a low potential voltage is applied from the pad PAD to the second electrodes 331 and 332, the second light-emitting layers 341 and 342 provided between the second electrodes 331 and 332 and the third electrodes 351 and 352 emit light with predetermined brightness in accordance with a predetermined current.

In the sub-pixels SP1 and SP2 according to one example embodiment of the present disclosure, at least one of the first light-emitting layers 321 and 322 and the second light-emitting layers 341 and 342 may emit light. For example, in the sub-pixels SP1 and SP2, voltages may be applied to the first electrodes 311 and 312 and the second electrodes 331 and 332, whereby only the first light-emitting layers 321 and 322 may emit light. In the sub-pixels SP1 and SP2, a first high potential voltage for allowing the first light-emitting layers 321 and 322 to emit light may be applied to the first electrodes 311 and 312. In other example embodiments, low potential voltage may be applied to the second electrodes 331 and 332. In other example embodiments, no voltage may be applied to the third electrodes 351 and 352. Therefore, the first light-emitting layers 321 and 322 provided between the first electrodes 311 and 312 and the second electrodes 331 and 332 may emit light but the second light-emitting layers 341 and 342 provided between the second electrodes 331 and 332 and the third electrodes 351 and 352 may not emit light.

In some example embodiments, in the sub-pixels SP1 and SP2, voltages may be applied to the second electrodes 331 and 332 and the third electrodes 351 and 352, whereby only the second light-emitting layers 341 and 342 may emit light. In the sub-pixels SP1 and SP2, no voltage may be applied to the first electrodes 311 and 312. A low potential voltage may be applied to the second electrodes 331 and 332. A second high potential voltage for allowing the second light-emitting layers 341 and 342 to emit light may be applied to the third electrodes 351 and 352. Therefore, the first light-emitting layers 321 and 322 provided between the first electrodes 311 and 312 and the second electrodes 331 and 332 may not emit light. However, the second light-emitting layers 341 and 342 provided between the second electrodes 331 and 332 and the third electrodes 351 and 352 may emit light.

In the sub-pixels SP1 and SP2, voltages may be applied to the first electrodes 311 and 312, the second electrodes 331 and 332, and the third electrodes 351 and 352. The first light-emitting layers 321 and 322 and the second light-emitting layers 341 and 342 may emit light. In the sub-pixels SP1 and SP2, a first high potential voltage for allowing the first light-emitting layers 321 and 322 to emit light may be applied to the first electrodes 311 and 312. A low potential voltage may be applied to the second electrodes 331 and 332. A second high potential voltage for allowing the second light-emitting layers 341 and 342 to emit light may be applied to the third electrodes 351 and 352. Because the first high potential voltage and the second high potential voltage may allow the light-emitting layers of different colors to emit light, the first high potential voltage and the second high potential voltage may be different from each other. Therefore, the first light-emitting layers 321 and 322 provided between the first electrodes 311 and 312 and the second electrodes 331 and 332 may emit light simultaneously with the second light-emitting layers 341 and 342 provided between the second electrodes 331 and 332 and the third electrodes 351 and 352.

In the display device 100 according to one example embodiment of the present disclosure, the first light-emitting layers 321 and 322 and the second light-emitting layers 341 and 342 may emit light independently in each of the sub-pixels SP1 and SP2. Therefore, the display device 100 according to one example embodiment of the present disclosure may reduce power consumption in comparison with a display device having a tandem structure in which a plurality of stacks are arranged by interposing a charge generating layer therebetween.

Also, in the display device 100 according to one example embodiment of the present disclosure, the third electrodes 351 and 352 may easily be connected to the second driving transistors 221 and 222 by using the mask patterns 261 and 262. In the display device 100 according to one example embodiment of the present disclosure, the mask patterns 261 and 262 are provided. The first light-emitting layers 321 and 322, the second electrodes 331 and 332, and the second light-emitting layers 341 and 342 may be provided on the entire surface of the first substrate 111 provided with the mask patterns 261 and 262, without a mask. The first light-emitting layers 321 and 322, the second electrodes 331 and 332, and the second light-emitting layers 341 and 342 may be disconnected in the opening areas OA1 and OA2 by the mask patterns 261 and 262.

Therefore, although the first light-emitting layers 321 and 322, the second electrodes 331 and 332, and the second light-emitting layers 341 and 342 are formed on the entire surface of the first substrate 111, the space where the third electrodes 351 and 352 may enter between the mask patterns 261 and 262 and the second driving transistors 221 and 222 may be obtained. The third electrodes 351 and 352 may enter between the mask patterns 261 and 262 and the second driving transistors 221 and 222 and may be connected to the source electrode or the drain electrode of the second driving transistors 221 and 222.

Figure 11:
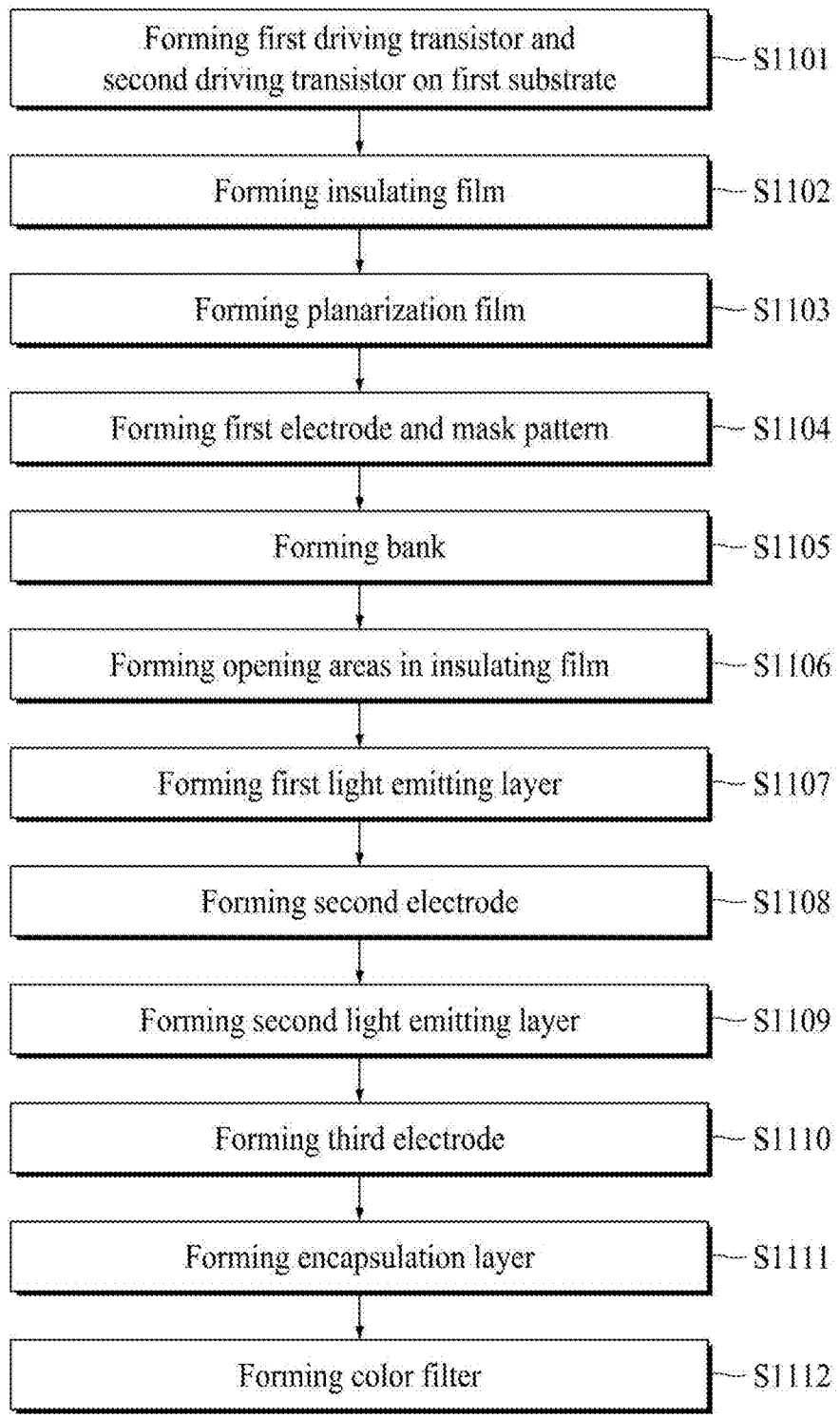
FIG. 11 is a flow chart illustrating a method for manufacturing a display device according to one example embodiment of the present disclosure.
Figure 12A:
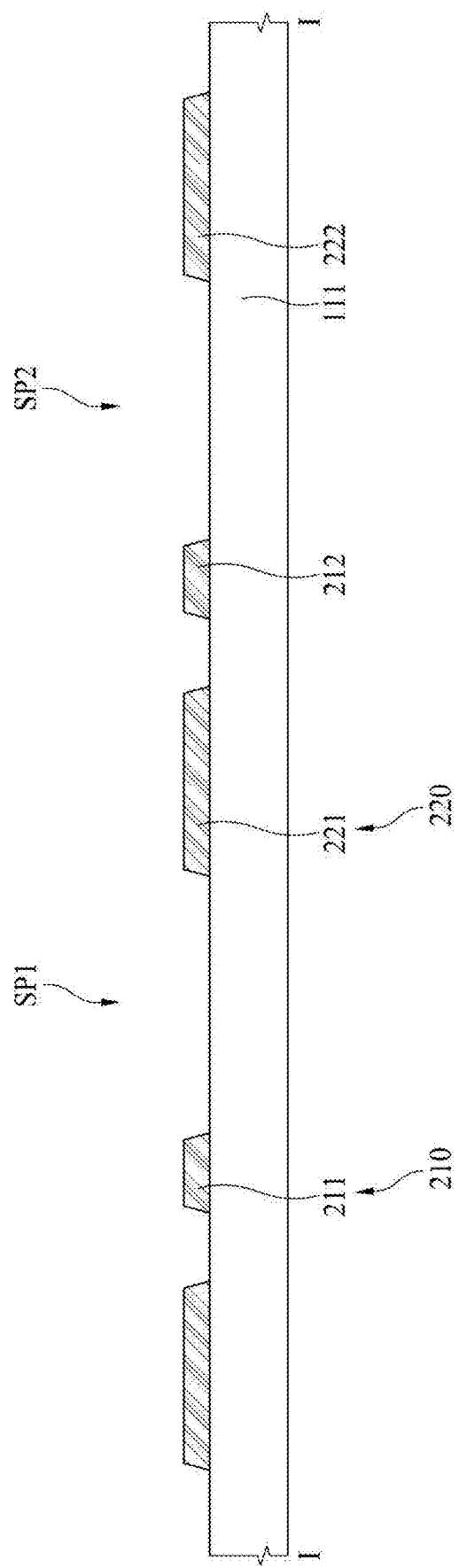

FIG. 11 is a flow chart illustrating a method for manufacturing a display device according to one example embodiment of the present disclosure. FIGS. 12A to 12L are cross-sectional views illustrating a method for manufacturing a display device according to the first example embodiment of the present disclosure. As illustrated in FIG. 12A, the first driving transistors 211 and 212 and the second driving transistors 221 and 222 are formed on the first substrate 111 (S1101). The active layer is formed on the first substrate 111. The active layer may be formed of a silicon-based semiconductor material or an oxide-based semiconductor material. The gate insulating film may be formed on the active layer. The gate insulating film may be formed of an inorganic film such as a silicon oxide film, a silicon nitride film, or a multi-layered film of the silicon oxide film and the silicon nitride film.

The gate electrode may be formed on the gate insulating film. The gate electrode may be a single layer or multiple layers including any one of Mo, Al, Cr, Au, Ti, Ni, Nd, and Cu and/or their alloy(s). An inter-layer dielectric film may be formed on the gate electrode. The inter-layer dielectric film may be formed of an inorganic film such as a silicon oxide film, a silicon nitride film, or a multi-layered film of the silicon oxide film and the silicon nitride film. The source electrode and the drain electrode may be formed on the inter-layer dielectric film. Each of the source electrode and the drain electrode may be connected to the active layer through the contact hole that passes through the gate insulating film and the inter-layer dielectric film. Each of the source electrode and the drain electrode may be a single layer or multiple layers including any one of Mo, Al, Cr, Au, Ti, Ni, Nd, and Cu and/or their alloy(s).

Figure 12B:
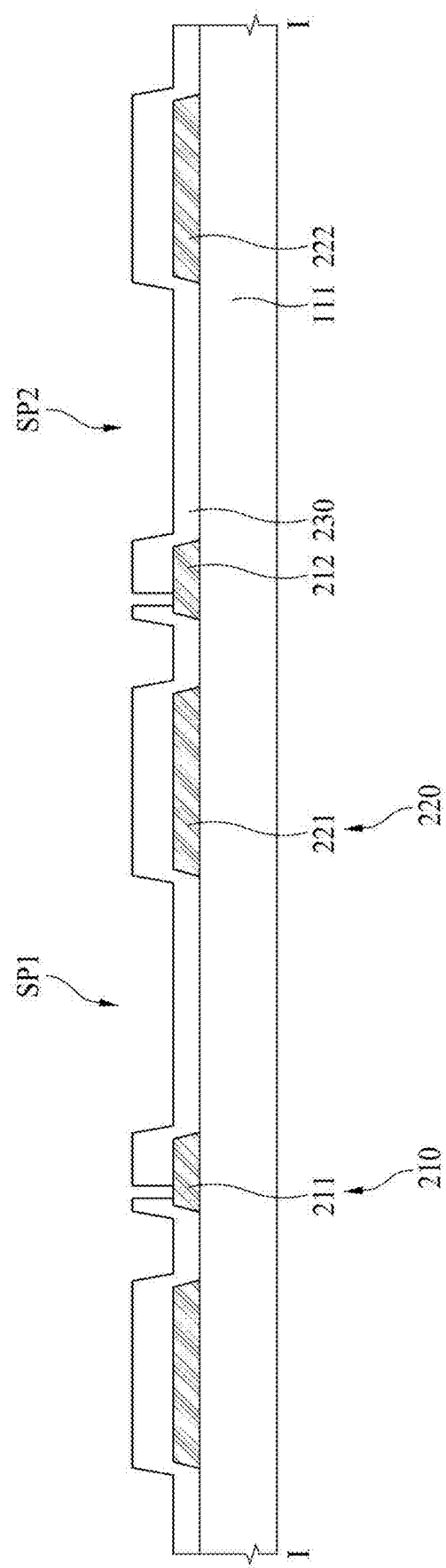

Next, the insulating film 230 is formed, as illustrated in FIG. 12B (S1102). The insulating film 230 is formed on the first driving transistors 211 and 212 and the second driving transistors 221 and 222. Although the contact hole that partially exposes the source electrode or the drain electrode of the first driving transistors 211 and 212 may be formed in the insulating film 230, formation of the contact hole is not limited to this case. The contact hole may be formed through a later process. The insulating film 230 may be formed of an inorganic film such as a silicon oxide film, a silicon nitride film, or a multi-layered film of the silicon oxide film and the silicon nitride film.

Figure 12C:
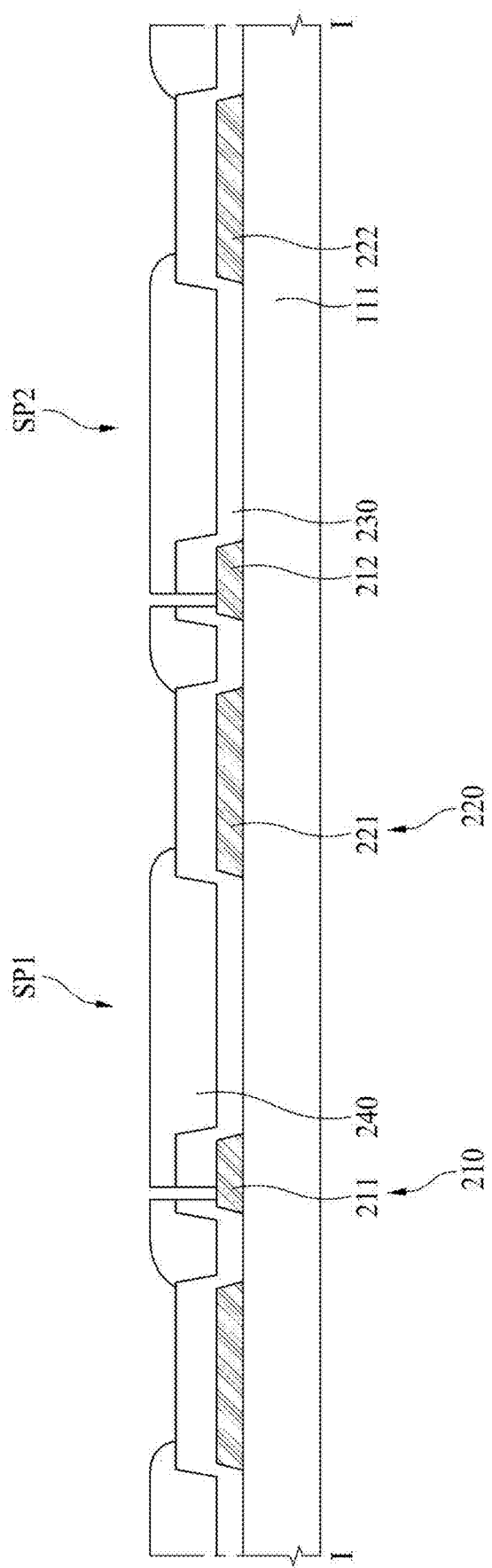

Next, the planarization film 240 is formed, as illustrated in FIG. 12C (S1103). The planarization film 240 is formed on the insulating film 230. The planarization film 240 planarizes the step difference due to the first driving transistors 211 and 212. The planarization film 240 may be patterned to partially expose the insulating film 230 arranged in the area where the second driving transistors 221 and 222 are formed. Although the contact hole that partially exposes the source electrode or the drain electrode of the first driving transistors 211 and 222 may be formed in the planarization film 240, formation of the contact hole is not limited to this case. The contact hole may be formed through a later process. The planarization film 240 may formed of an organic film such as acrylic resin, epoxy resin, phenolic resin, polyamide resin, and polyimide resin.

Figure 12D:
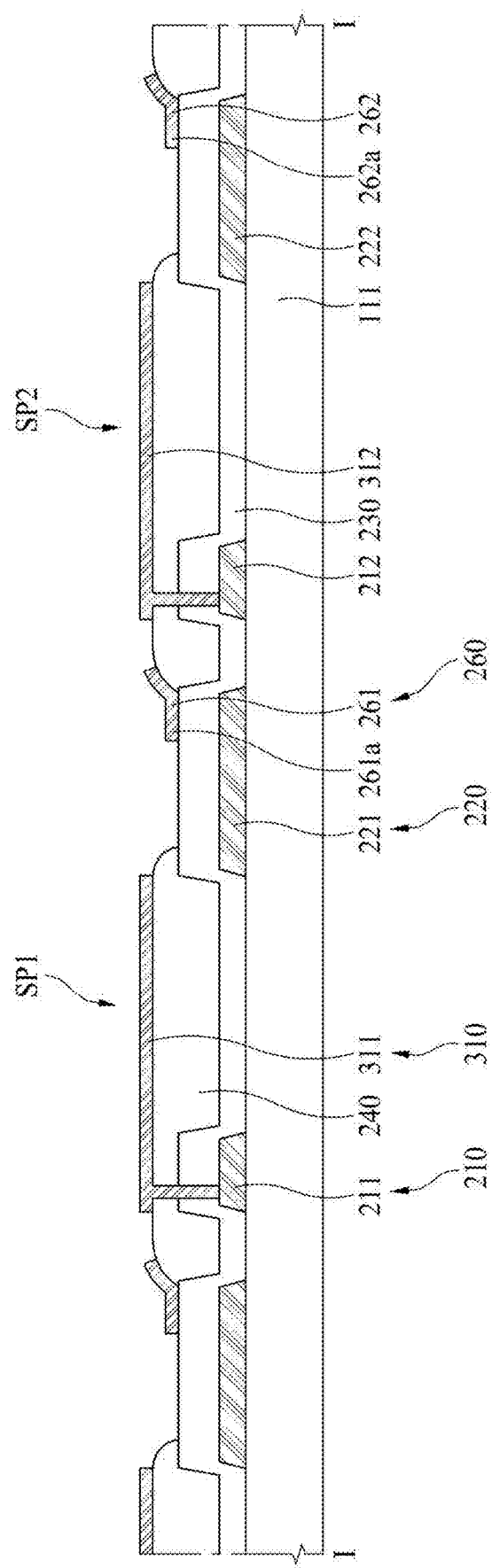

Next, the first electrodes 311 and 312 and the mask patterns 261 and 262 are formed, as illustrated in FIG. 12D (S1104). The first electrodes 311 and 312 may be formed on the planarization film 240 for each of the sub-pixels SP1 and SP2. The first electrodes 311 and 312 may be connected to the source electrode or the drain electrode of the first driving transistors 211 and 212 through the contact holes.

The first electrodes 311 and 312 may be formed of a transparent metal material, a semi-transmissive metal material, and/or a metal material with high reflexibility. If the display device 100 is formed in a top emission type, the first electrodes 311 and 312 may be formed of a metal material with high reflexibility such as a deposition structure (Ti/Al/Ti) of Al and Ti, a deposition structure (ITO/Al/ITO) of Al and ITO, an Ag alloy, and/or a deposition structure (ITO/Ag alloy/ITO) of Ag alloy and ITO. The Ag alloy may be an alloy of Ag, Pd, and/or Cu. If the display device 100 is formed in a bottom emission type, the first electrodes 311 and 312 may be formed of a transparent conductive material (TCO) such as ITO and IZO that may transmit light, a semi-transmissive conductive material such as Mg or Ag, and/or an alloy of Mg or Ag. The first electrodes 311 and 312 may be anode electrodes.

Figure 12E:
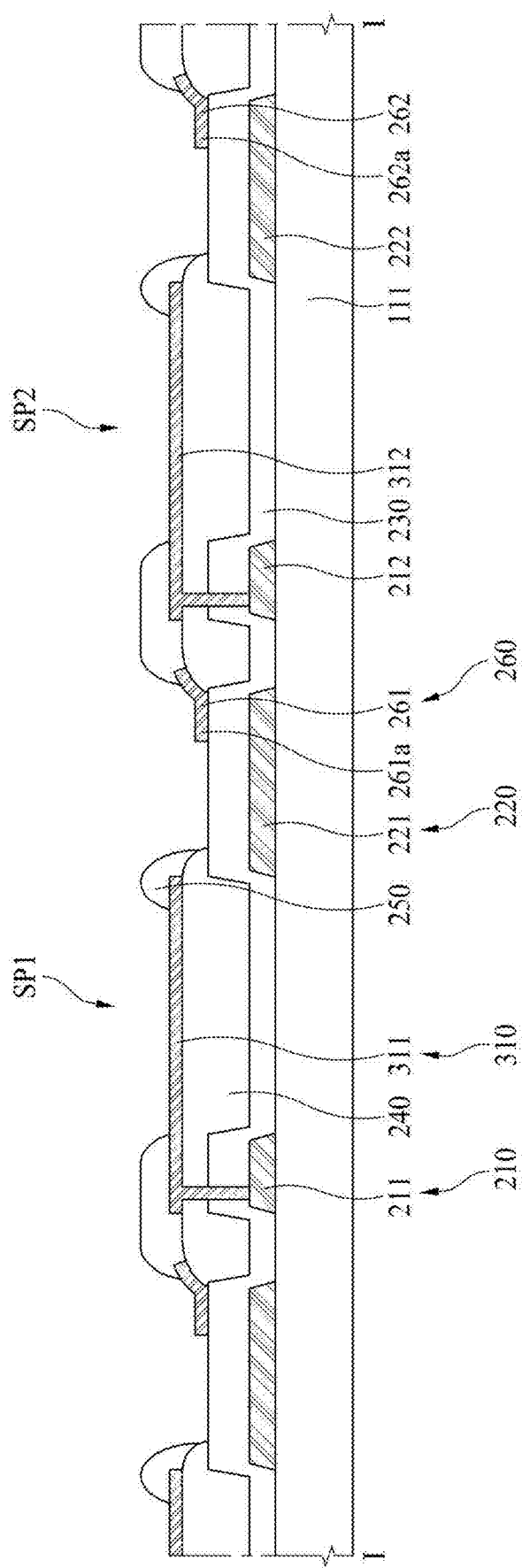

The mask patterns 261 and 262 may be formed on the planarization film 240 to be spaced apart from the first electrodes 311 and 312. The mask patterns 261 and 262 may also be formed on a partial portion of the insulating film 230 exposed without being covered by the planarization film 240. The mask patterns 261 and 262 may be formed of the same material as that of the first electrodes 311 and 312 simultaneously with the first electrodes 311 and 312. Next, the bank 250 is formed, as illustrated in FIG. 12E (S1105). The bank 250 may be formed to cover an end of each of the first electrodes 311 and 312. The bank 250 may be patterned to expose a partial portion of the insulating film 230 and the mask patterns 261 and 262, that are arranged in the area where the second driving transistors 221 and 222 are formed.

Figure 12F:
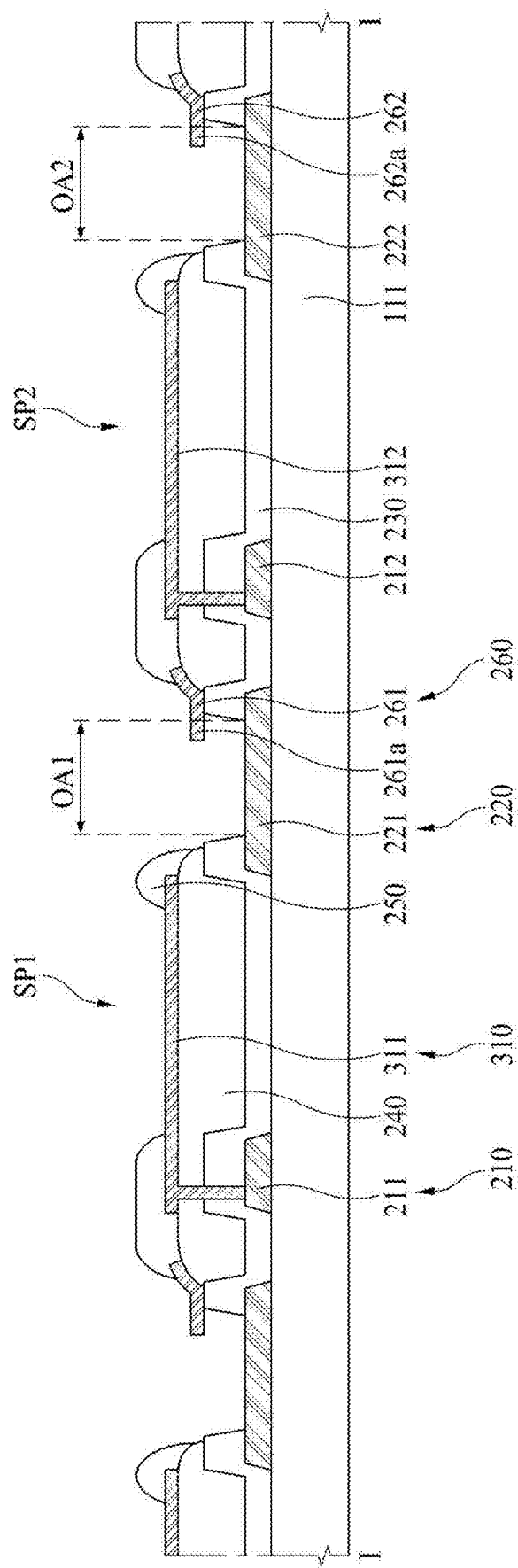

Next, the opening areas OA1 and OA2 are formed in the insulating film 230, as illustrated in FIG. 12F (S1106). The opening area OA1 and OA2 are formed in the insulating film 230 by an etching process. The etching process may be a wet etching process. An etching solution that can etch the insulating film 230 but cannot etch the mask patterns 261 and 262 may be applied in the etching process. Therefore, an undercut structure may be formed in which the mask patterns 261 and 262 are not etched and the exposed insulating film 230 is only etched. The first opening area OA1 for partially exposing the second driving transistor 221 and the second opening area OA2 for partially exposing the other second driving transistor 222 may be formed in the insulating film 230 through the etching process.

Next, the first light-emitting layers 321 and 322 are formed, as illustrated in FIG. 12G (S1107). The first light-emitting layers 321 and 322 are formed on the first electrodes 311 and 312 and the mask patterns 261 and 262. The first light-emitting layers 321 and 322 may be formed by a deposition process or a solution process. If the first light-emitting layers 321 and 322 are formed by the deposition process, the first light-emitting layers 321 and 322 may be formed using an evaporation method.

The first light-emitting layers 321 and 322 are disconnected between the first sub-pixel SP1 and the second sub-pixel SP2 by the mask patterns 261 and 262. The first light-emitting layers 321 and 322 may be disconnected on the mask patterns 261 and 262. Also, the first light-emitting layers 321 and 322 may be formed on the second driving transistors 221 and 222 exposed without being covered by the protrusions 261a and 262a of the mask patterns 261 and 262. Each of the first light-emitting layers 321 and 322 may be at least one of: a red light-emitting layer for emitting red light, a green light-emitting layer for emitting green light, a blue light-emitting layer for emitting blue light, a yellow light-emitting layer for emitting yellow light, a cyan light-emitting layer for emitting cyan light, a magenta light-emitting layer for emitting magenta light, and an orange light-emitting layer for emitting orange light.

Figure 12H:
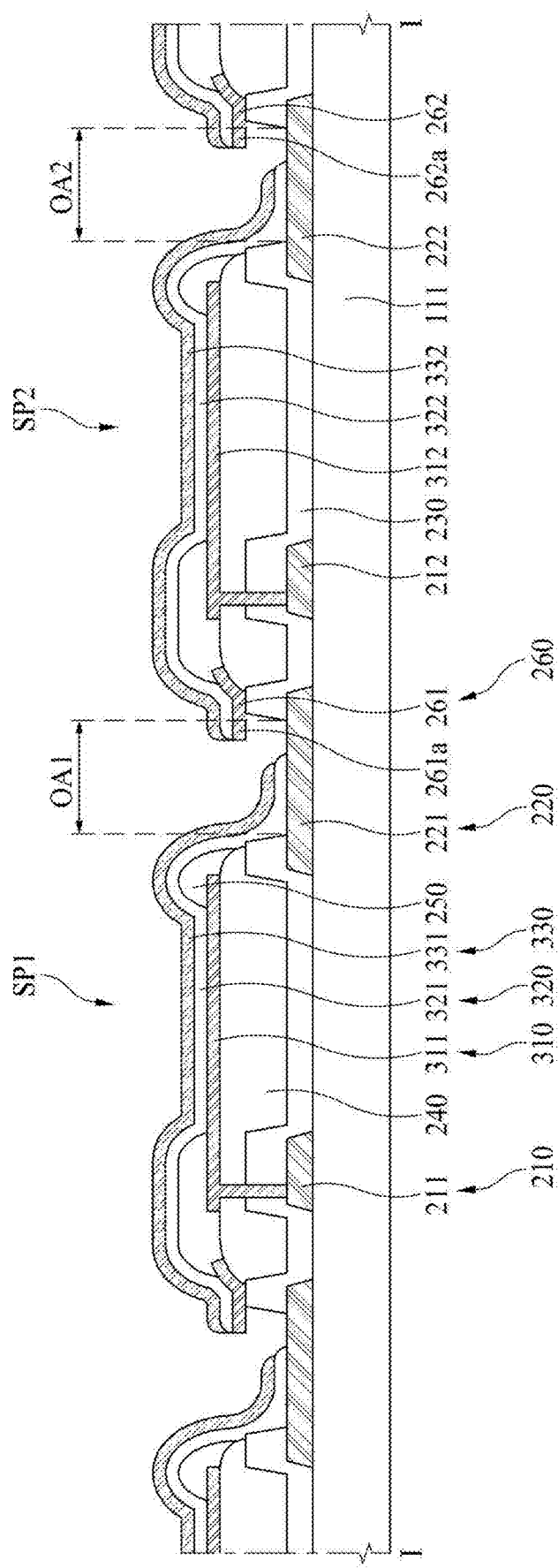

Next, the second electrodes 331 and 332 are formed, as illustrated in FIG. 12H (S1108). The second electrodes 331 and 332 may be formed on the first light-emitting layers 321 and 322. The second electrodes 331 and 332 may be disconnected between the first sub-pixel SP1 and the second sub-pixel SP2 by the mask patterns 261 and 262. The second electrodes 331 and 332 may be disconnected on the mask patterns 261 and 262. Also, the second electrodes 331 and 332 may be formed on the first light-emitting layers 321 and 322 exposed without being covered by the protrusions 261a and 262a of the mask patterns 261 and 262.

The second electrodes 331 and 332 may be formed using an evaporation instead of a physics vapor deposition such as sputtering. This is because the second electrode 331 of the first sub-pixel SP1 and the second electrode 332 of the second sub-pixel SP2 may be connected to the second driving transistors 221 and 222 as a film formed by the physics vapor deposition. Physics vapor deposition such as sputtering has excellent step coverage characteristics. The second electrodes 331 and 332 may be formed of a transparent conductive material (TCO) such as ITO and IZO that may transmit light, a semi-transmissive conductive material such as Mg or Ag, and/or an alloy of Mg or Ag.

Figure 12I:
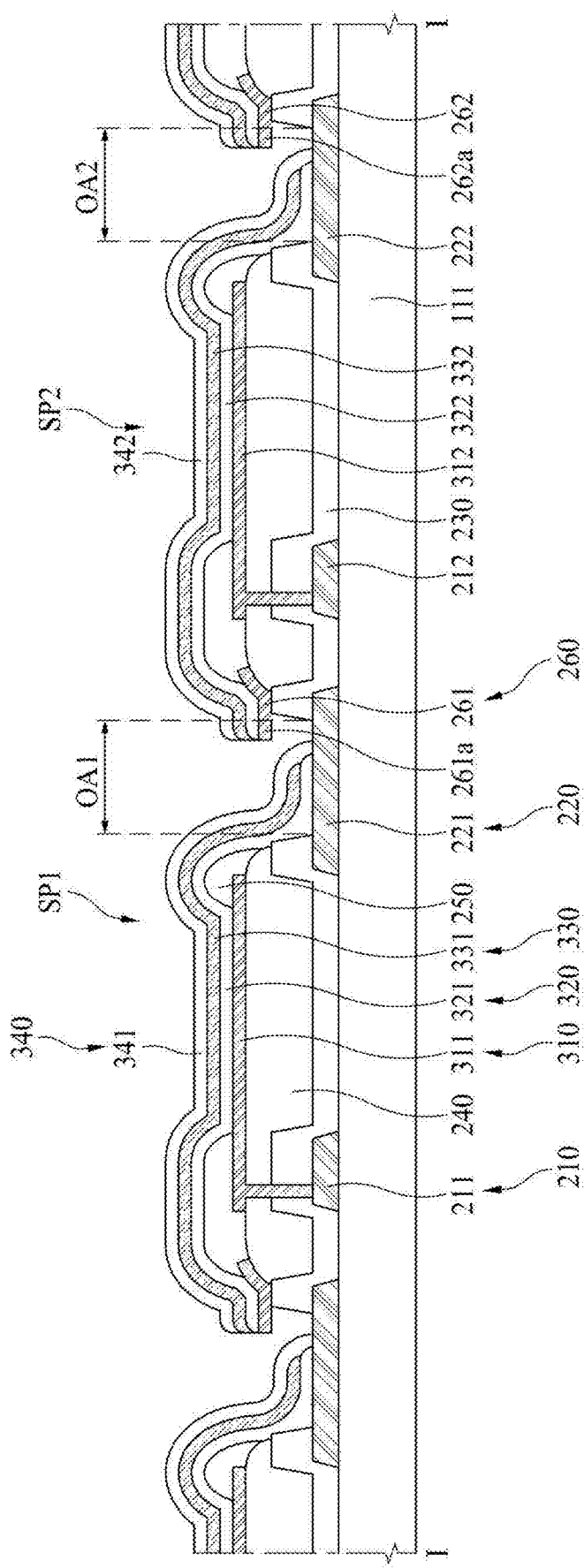

Next, the second light-emitting layers 341 and 342 are formed, as illustrated in FIG. 12I (S1109). The second light-emitting layers 341 and 342 are formed on the second electrodes 331 and 332. The second light-emitting layers 341 and 342 may be formed by a deposition process or a solution process. If the second light-emitting layers 341 and 342 are formed by the deposition process, the second light-emitting layers 341 and 342 may be formed using an evaporation method. The second light-emitting layers 341 and 342 may be disconnected between the first sub-pixel SP1 and the second sub-pixel SP2 by the mask patterns 261 and 262. The second light-emitting layers 341 and 342 may be disconnected on the mask patterns 261 and 262. Also, the second light-emitting layers 341 and 342 may be formed on the second electrodes 331 and 332 exposed without being covered by the protrusions 261a and 262a of the mask patterns 261 and 262.

The second light-emitting layer 340 may be at least one of: a red light-emitting layer for emitting red light, a green light-emitting layer for emitting green light, a blue light-emitting layer for emitting blue light, a yellow light-emitting layer for emitting yellow light, a cyan light-emitting layer for emitting cyan light, a magenta light-emitting layer for emitting magenta light and an orange light-emitting layer for emitting orange light. However, the second light-emitting layers 341 and 342 may emit light of a color different from that of the first light-emitting layers 321 and 322. If the first light-emitting layers 321 and 322 are light-emitting layers for emitting light of a first color, the second light-emitting layers 341 and 342 may be light-emitting layers for emitting light of a second color different from the first color.

Any one of light of the first color and light of the second color may be mixed light of two different colors. For example, the first light-emitting layers 321 and 322 may be yellow light-emitting layers for emitting yellow light that is mixed light of green and red, and the second light-emitting layers 341 and 342 may be blue light-emitting layers for emitting blue light. Alternatively, the second light-emitting layers 341 and 342 may be yellow light-emitting layers for emitting yellow light that is mixed light of green and red, and/or the first light-emitting layers 321 and 322 may be blue light-emitting layers for emitting blue light.

Figure 12J:
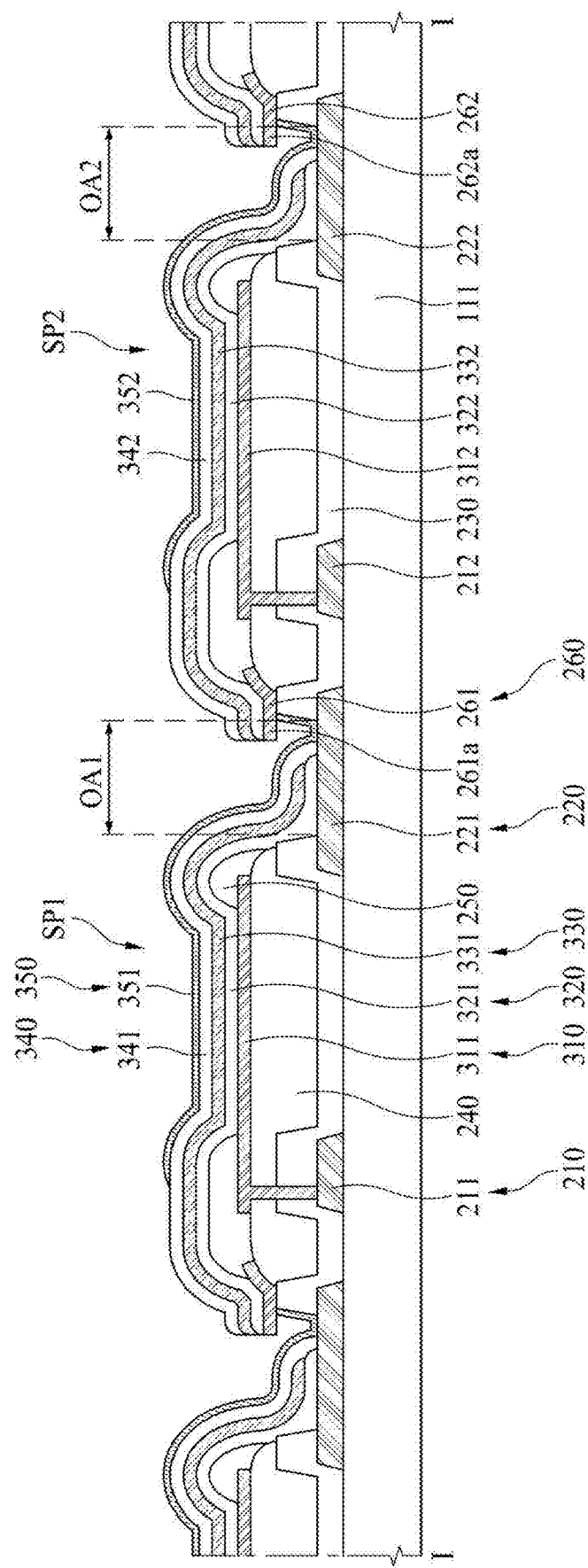

Next, the third electrodes 351 and 352 are formed, as illustrated in FIG. 12J (S1110). The third electrodes 351 and 352 may be formed on the second light-emitting layers 341 and 342. The third electrodes 351 and 352 may be formed by a physics vapor deposition such as sputtering. The third electrodes 351 and 352 may be disconnected between the first sub-pixel SP1 and the second sub-pixel SP2 by the mask patterns 261 and 262. The third electrodes 351 and 352 may be disconnected from each other on the mask patterns 261 and 262. Also, the third electrodes 351 and 352 may enter the space between the protrusions 261a and 262a of the mask patterns 261 and 262 and the second light-emitting layers 341 and 342, and thus may be formed below the protrusions 261a and 262a of the mask patterns 261 and 262. Because a film formed by the physics vapor deposition such as sputtering has excellent step coverage characteristics, the third electrodes 351 and 352 may be deposited below the protrusions 261a and 262a of the mask patterns 261 and 262 at an area wider than the first light-emitting layers 321 and 322, the second electrodes 331 and 332, and the second light-emitting layers 341 and 342.

The third electrodes 351 and 352 may be formed of a transparent metal material, a semi-transmissive metal material, and/or a metal material with high reflexibility. If the display device 100 is formed in a top emission type, the third electrodes 351 and 352 may be formed of a transparent conductive material (TCO) such as ITO and IZO that may transmit light, a semi-transmissive conductive material, such as Mg or Ag, and/or an alloy of Mg or Ag. If the display device 100 is formed in a bottom emission type, the third electrodes 351 and 352 may be formed of a metal material with high reflexibility such as a deposition structure (Ti/Al/Ti) of Al and Ti, a deposition structure (ITO/Al/ITO) of Al and ITO, an Ag alloy, and/or a deposition structure (ITO/Ag alloy/ITO) of Ag alloy and ITO. The Ag alloy may be an alloy of Ag, Pd, and/or Cu. The third electrodes 351 and 352 may be anode electrodes.

Figure 12L:
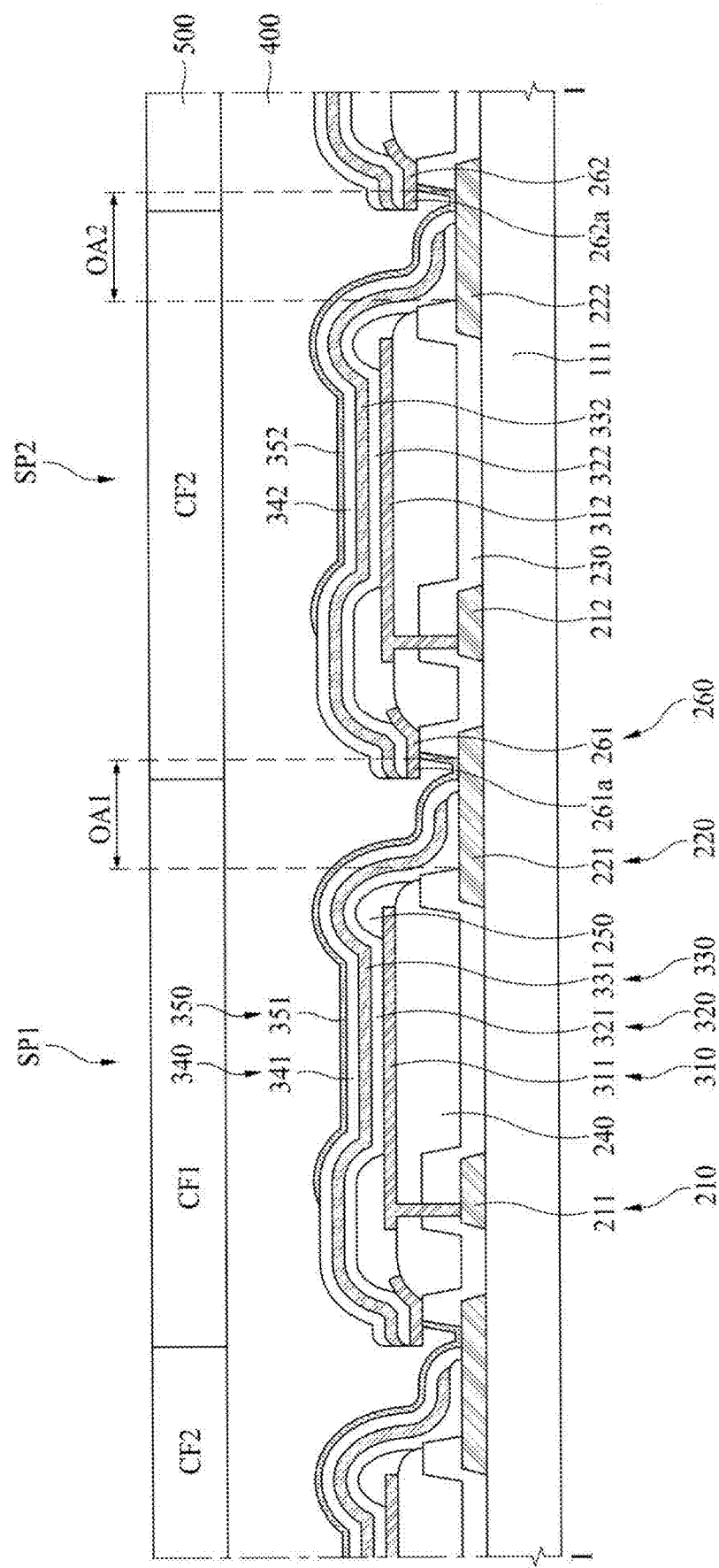

Next, the encapsulation layer 400 is formed, as illustrated in FIG. 12K (S1111). The encapsulation layer 400 may be formed on the third electrodes 351 and 352. The encapsulation layer 400 may be made of an inorganic insulating material or a structure in which an inorganic material and an organic material are deposited alternately. Next, the color filter 500 is formed, as illustrated in FIG. 12L (S1112). The color filter 500 is formed on the encapsulation layer 400. The first color filter CF1 is formed to correspond to the first sub-pixel SP1 and the second color filter CF2 is formed to correspond to the second sub-pixel SP2. Each of the first color filter CF1 and the second color filter CF2 may be formed of a material known in the art, such as a dye, pigment, resin, and/or dielectric, that absorbs light of a specific wavelength range.

Each of the first color filter CF1 and the second color filter CF2 may absorb at least one of light of a blue wavelength range, light of a green wavelength range, and light of a red wavelength range, and/or may transmit only light of other wavelength ranges. The light transmitted from each of the first color filter CF1 and the second color filter CF2 may include light of the blue wavelength range, light of the green wavelength range, and/or light of the red wavelength range. For example, the first light-emitting layers 321 and 322 may emit light of the blue wavelength range, and the second light-emitting layers 341 and 344 may emit yellow light that is mixed light of green and red. The first color filter CF1 may include a pigment or dye that absorbs light of the red wavelength range. The first color filter CF1 may absorb light of the red wavelength range, and may transmit light of the blue wavelength range and light of the green wavelength range. Therefore, the first sub-pixel SP1 may emit the blue light and the green light.

The second color filter CF2 may include a pigment or dye that absorbs light of the blue wavelength range, and may include a pigment or dye that absorbs light of the green wavelength range. The second color filter CF2 may absorb light of the blue wavelength range and/or light of the green wavelength range, and/or may transmit only light of the red wavelength range. Therefore, the second sub-pixel SP2 may emit the red light. For another example, the first light-emitting layers 321 and 322 may emit light of the blue wavelength range, and the second light-emitting layers 341 and 344 may emit yellow light that is mixed light of green and red. The first color filter CF1 may include a pigment or dye that absorbs light of the red wavelength range. The first color filter CF1 may absorb light of the red wavelength range, and may transmit light of the blue wavelength range and light of the green wavelength range. Therefore, the first sub-pixel SP1 may emit the blue light and the green light.

The second color filter CF2 may include a pigment or dye that absorbs light of the green wavelength range. The second color filter CF2 may absorb light of the green wavelength range, and may transmit light of the blue wavelength range and light of the red wavelength range. Therefore, the second sub-pixel SP2 may emit the blue light and the red light. Although FIG. 12I shows that the color filter 500 is formed on the encapsulation layer 400, the color filter 500 may be formed below the first electrode 310 in another example embodiment without limitation to the example of FIG. 12I.

Figure 13A:
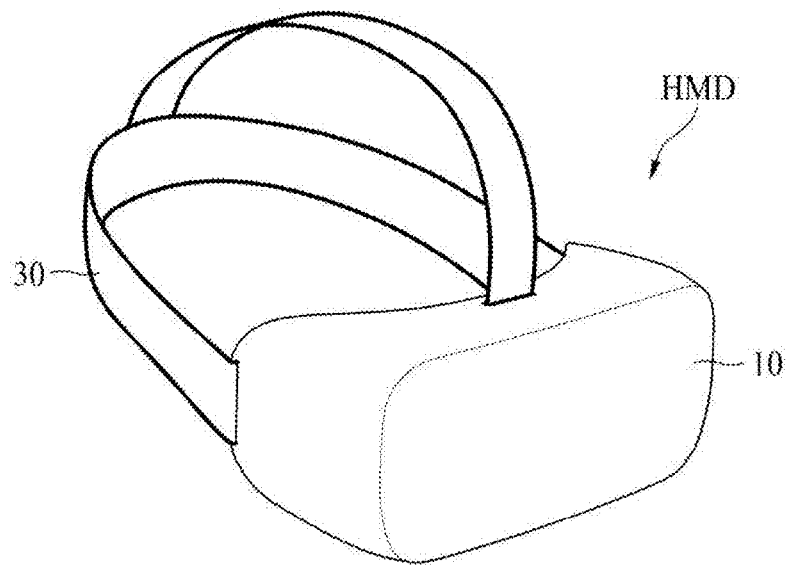
FIGS. 13A to 13C illustrate a display device according to another example embodiment of the present disclosure, that relates to a head mounted display (HMD).
Figure 13B:
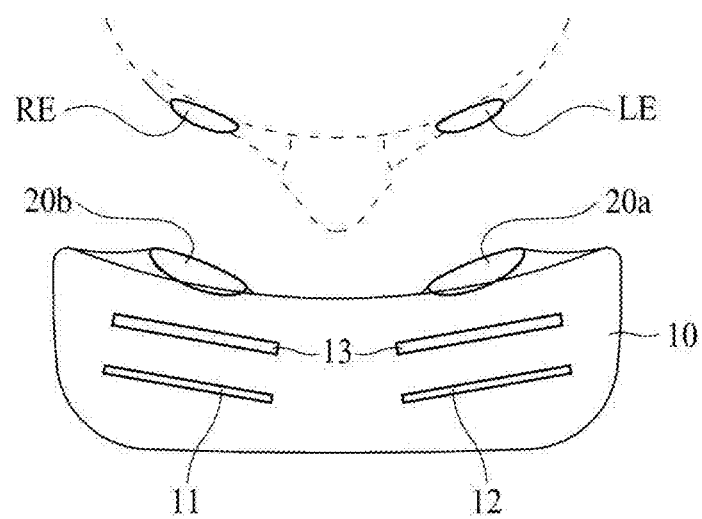
Figure 13C:
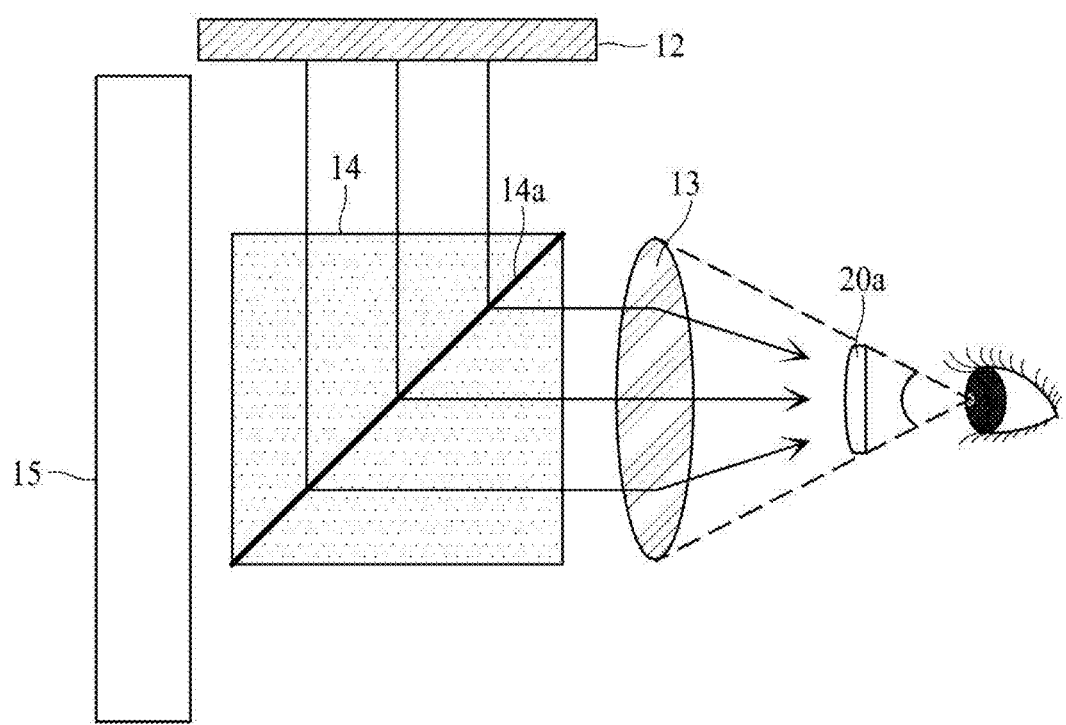

FIGS. 13A to 13C illustrate a display device according to another example embodiment of the present disclosure, that relates to a head mounted display (HMD). FIG. 13A is a perspective view, FIG. 13B is a plan view of a virtual reality (VR) structure, and FIG. 13C is a cross-sectional view of an augmented reality (AR) structure. As illustrated in FIG. 13A, the head mounted display device according to the present disclosure includes a receiving case 10 and a head mounted band 30. The receiving case 10 receives the display device, a lens array, and an ocular lens therein. The head mounted band 30 may be fixed to the receiving case 10. In an example embodiment, the head mounted band 30 may be formed to surround an upper side and both sides of a user's head. However, the head mounted band 30 may be replaced with a glasses type structure or a helmet type structure.

As illustrated in FIG. 13B, a head mounted display device of a virtual reality (VR) structure according to the present disclosure includes a left-eye display device 12, a right-eye display device 11, a lens array 13, a left-eye ocular lens 20a, and a right-eye ocular lens 20b. The left-eye display device 12, the right-eye display device 11, the lens array 13, the left-eye ocular lens 20a and the right-eye ocular lens 20b are received in the aforementioned receiving case 10.

The left-eye display device 12 and the right-eye display device 11 may display the same image, and the user may view a two-dimensional image. Alternatively, the left-eye display device 12 may display a left-eye image, and the right-eye display device 11 may display a right-eye image. The user may view a stereoscopic image. Each of the left-eye display device 12 and the right-eye display device 11 may be the display device according to FIGS. 1 to 10. In an upper portion corresponding to a surface where an image is displayed in FIGS. 1 to 10, for example, a color filter layer (not illustrated) may face the lens array 13.

The lens array 13 may be provided between the left-eye ocular lens 20a and the left-eye display device 12 while being spaced apart from each of the left-eye ocular lens 20a and the left-eye display device 12. That is, the lens array 13 may be disposed at the front of the left-eye ocular lens 20a and the rear of the left-eye display device 12. Also, the lens array 13 may be provided between the right-eye ocular lens 20b and the right-eye display device 11 while being spaced apart from each of the right-eye ocular lens 20b and the right-eye display device 11. That is, the lens array 13 may be disposed at the front of the right-eye ocular lens 20b and the rear of the right-eye display device 11.

The lens array 13 may be a micro lens array. The lens array 13 may be replaced with a pin hole array. The image displayed on the left-eye display device 12 or the right-eye display device 11 by the lens array 13 may be viewed by the user in an enlarged size. The user's left eye (LE) may be disposed in the left ocular lens 20a, and the user's right eye (RE) may be disposed in the right ocular lens 20b.

As illustrated in FIG. 13C, a head mounted display device of an augmented reality (AR) structure according to the present disclosure includes a left-eye display device 12, a lens array 13, a left-eye ocular lens 20a, a transmissive reflector 14, and a transmissive window 15. FIG. 13 illustrates elements for only a left-eye for convenience, and elements for a right-eye may be the same as those for the left-eye.

The left-eye display device 12, the lens array 13, the left-eye ocular lens 20a, the transmissive reflector 14, and the transmissive window 15 are received in the aforementioned receiving case 10. The left-eye display device 12 may be disposed at one side of the transmissive reflector 14, for example, an upper side without covering the transmissive window 15. Therefore, the left-eye display device 12 may provide an image to the transmissive reflector 14 without covering an external background viewed through the transmissive window 15. The left-eye display device 12 may be the display device according to FIGS. 1 to 10. In an upper portion corresponding to a surface where an image is displayed in FIGS. 1 to 10, for example, a color filter layer (not illustrated) may face the transmissive reflector 14. The lens array 13 may be provided between the left-eye ocular lens 20a and the transmissive reflector 14. The user's left eye is disposed in the left-eye ocular lens 20a.

The transmissive reflector 14 is disposed between the lens array 13 and the transmissive window 15. The transmissive reflector 14 may include a reflective surface 14a that transmits a portion of light and reflects the other portion of light. The reflective surface 14a may be formed to allow the image displayed on the left-eye display device 12 to advance to the lens array 13. Therefore, the user may view the external background and the image displayed by the left-eye display device 12 through the transmissive window 15. That is, because the user may overlap a background of a reality and a virtual image and then view them as one image, augmented reality (AR) may be realized. The transmissive window 15 may be disposed at the front of the transmissive reflector 14.

It will be apparent to those skilled in the art that various modifications and variations can be made in the display device of the present disclosure without departing from the technical idea or scope of the disclosure. Thus, it is intended that the present disclosure cover the modifications and variations of this disclosure provided they come within the scope of the appended claims and their equivalents.

What is claimed is:

1. A display device, comprising:
   a substrate including a plurality of pixels, each of the plurality of pixels including only a first sub-pixel and a second sub-pixel;
   a first electrode in each of the first sub-pixel and the second sub-pixel;
   a third electrode in each of the first sub-pixel and the second sub-pixel;
   a second electrode between the first electrode and the third electrode;
   a first light-emitting layer between the first electrode and the second electrode, the first light-emitting layer being configured to emit light of a first color;
   a second light-emitting layer between the second electrode and the third electrode, the second light-emitting layer being configured to emit mixed light of second and third colors that are different from each other;
   a color filter including:
   a first color filter corresponding to the first sub-pixel; and
   a second color filter corresponding to the second sub-pixel, a first driving transistor in each of the first sub-pixel and the second sub-pixel, and configured to apply a first voltage to the first electrode;
a second driving transistor in each of the first sub-pixel and the second sub-pixel, and configured to apply a second voltage to the third electrode;
an insulating film on the first driving transistor and the second driving transistor, the insulating film including an opening area that partially exposes the second driving transistor; and
a mask pattern on the insulating film between the first sub-pixel and the second sub-pixel, and including a protrusion that partially covers the opening area,
wherein each of the first sub-pixel and the second sub-pixel is configured to allow the first light-emitting layer and the second light-emitting layer to emit light independently,
wherein each of the plurality of pixels is configured to emit light of at least three colors,
wherein the first color filter is configured to:
transmit the light of the first color emitted from the first light-emitting layer,
transmit the light of the second color of the mixed light emitted from the second light-emitting layer, and
block light of the third color of the mixed light emitted from the second light-emitting layer,
wherein the second color filter is configured to:
transmit the light of the third color of the mixed light emitted from the second light-emitting layer, and
block light of the second color of the mixed light emitted from the second light-emitting layer,
wherein the third electrode directly contacts the second driving transistor below the mask pattern in the opening area,
wherein the mask pattern and the third electrode are provided on different layers,
wherein a surface of the protrusion of the mask pattern facing away from the first light-emitting layer faces toward the substrate, and
wherein the first light-emitting layer directly contacts an upper surface of the protrusion of the mask pattern in the second sub-pixel.

2. The display device according to claim 1, wherein each of the first sub-pixel and the second sub-pixel is further configured to allow at least one of the first light-emitting layer and the second light-emitting layer to emit light.

3. The display device according to claim 1, wherein the first electrode is connected to the first driving transistor through a contact hole that passes through the insulating film.

4. The display device according to claim 1, wherein the mask pattern is formed of the same material as that of the first electrode.

5. The display device according to claim 1, wherein the mask pattern is spaced apart from the first electrode.

6. The display device according to claim 1, wherein the third electrode in each of the first sub-pixel and the second sub-pixel are on the first electrode; and wherein the mask pattern is provided on the same layer as the first electrode and is spaced apart from the first electrode.

7. The display device according to claim 1, wherein, along a stacking direction of the first light-emitting layer and the second electrode, the first light-emitting layer is interposed between the protrusion and the second electrode.

8. A display device, comprising:
a substrate including a plurality of pixels, each of the plurality of pixels including only a first sub-pixel and a second sub-pixel;
a first driving transistor in each of the first sub-pixel and the second sub-pixel on the substrate;
a second driving transistor in each of the first sub-pixel and the second sub-pixel on the substrate;
a first electrode in each of the first sub-pixel and the second sub-pixel, the first electrode being connected to the first driving transistor;
a first light-emitting layer on the first electrode, the first light-emitting layer being configured to emit light of a first color;
a second electrode on the first light-emitting layer;
a second light-emitting layer on the second electrode, the second light-emitting layer being configured to emit light of a second color;
a third electrode in each of the first sub-pixel and the second sub-pixel on the second light-emitting layer, the third electrode being connected to the second driving transistor;
a color filter including:
a first color filter corresponding to the first sub-pixel; and
a second color filter corresponding to the second sub-pixel;
an insulating film on the first driving transistor and the second driving transistor, the insulating film including an opening area that partially exposes the second driving transistor; and
a mask pattern on the insulating film between the first sub-pixel and the second sub-pixel, and including a protrusion that partially covers the opening area,
wherein each of the first sub-pixel and the second sub-pixel is configured to allow the first light-emitting layer and the second light-emitting layer to emit light independently,
wherein one of the light of the first color and the light of the second color is single light of one color,
wherein the other of the light of the first color and the light of the second color is mixed light of two different colors,
wherein the first color filter is configured to:
transmit the single light of one color and a partial portion of the mixed light of two different colors, and
block a remaining portion of the mixed light of two different colors, and wherein the second color filter is configured to:
transmit the remaining portion of the mixed light of two different colors, and
block the partial portion of the mixed light of two different colors,
wherein the third electrode directly contacts the second driving transistor below the mask pattern in the opening area,
wherein the mask pattern and the third electrode are provided on different layers,
wherein a lower surface of the protrusion of the mask pattern facing away from the first light-emitting layer faces toward the substrate, and
wherein the first light-emitting layer directly contacts an upper surface of the protrusion of the mask pattern in the second sub-pixel.

9. The display device according to claim 8, wherein:
each of the first electrode and the third electrode is an anode electrode; and
the second electrode is a cathode electrode.

10. The display device according to claim 9, wherein:
the first light-emitting layer is further configured to emit the light of the first color in response to a voltage applied to the first electrode and the second electrode; and
the second light-emitting layer is further configured to emit the light of the second color in response to a voltage applied to the second electrode and the third electrode.

11. The display device according to claim 8, wherein the third electrode is connected to the second driving transistor below the mask pattern.

12. The display device according to claim 8, wherein each of the first sub-pixel and the second sub-pixel is configured to emit light of at least three colors.

13. The display device according to claim 8, wherein the mask pattern is provided on the same layer as the first electrode and is spaced apart from the first electrode.

\* \* \* \* \*